(12) United States Patent
Ejima et al.

(10) Patent No.: US 10,985,128 B2
(45) Date of Patent: Apr. 20, 2021

(54) ANISOTROPIC CONDUCTIVE FILM

(71) Applicant: DEXERIALS CORPORATION, Tokyo (JP)

(72) Inventors: Koji Ejima, Tokyo (JP); Kenichi Hirayama, Kawasaki (JP); Reiji Tsukao, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 16/464,854

(22) PCT Filed: Nov. 20, 2017

(86) PCT No.: PCT/JP2017/041684
§ 371 (c)(1),
(2) Date: May 29, 2019

(87) PCT Pub. No.: WO2018/101106
PCT Pub. Date: Jun. 7, 2018

(65) Prior Publication Data
US 2019/0304943 A1 Oct. 3, 2019

(30) Foreign Application Priority Data

Dec. 1, 2016 (JP) .............................. JP2016-233715
Aug. 23, 2017 (JP) .............................. JP2017-160655

(51) Int. Cl.
*H01L 23/00* (2006.01)
*H01B 1/22* (2006.01)
(Continued)

(52) U.S. Cl.
CPC ............. *H01L 24/29* (2013.01); *H01B 1/22* (2013.01); *H01B 5/14* (2013.01); *H01L 24/32* (2013.01);
(Continued)

(58) Field of Classification Search
CPC ....... H01L 2224/83851; H01L 23/3733; H01L 23/3737; H01B 1/22; H05K 2201/09945; H05K 3/323; H05K 2203/0278
See application file for complete search history.

(56) References Cited

U.S. PATENT DOCUMENTS 4,646,764 A * 3/1987 Young .................. A24B 3/14
131/324
6,461,054 B1 * 10/2002 Iwase .................. G02B 6/3849
385/70
(Continued)

FOREIGN PATENT DOCUMENTS

CN 103178033 A 6/2013
CN 104541411 A 4/2015
(Continued)

OTHER PUBLICATIONS

Dec. 26, 2017 International Search Report issued in International Patent Application No. PCT/JP2017/041684.
(Continued)

*Primary Examiner* — David A Zarneke
(74) *Attorney, Agent, or Firm* — Oliff PLC

(57) ABSTRACT

An anisotropic conductive film has a structure in which high hardness conductive particles having a 20% compression elastic modulus of 8000 to 28000 N/mm² and low hardness conductive particles having a lower 20% compression elastic modulus than that of the high hardness conductive particles are dispersed as conductive particles in an insulating resin layer. The number density of all the conductive particles is 6000 particles/mm² or more, and the number density of the low hardness conductive particles is 10% or more of that of all the conductive particles.

17 Claims, 9 Drawing Sheets

(51) Int. Cl.
*H01B 5/14* (2006.01)
*H01R 12/61* (2011.01)
*H01L 23/373* (2006.01)

(52) U.S. Cl.
CPC ............ *H01L 24/83* (2013.01); *H01R 12/61* (2013.01); *H01L 23/3733* (2013.01); *H01L 23/3737* (2013.01); *H01L 2224/294* (2013.01); *H01L 2224/2929* (2013.01); *H01L 2224/2939* (2013.01); *H01L 2224/29339* (2013.01); *H01L 2224/29344* (2013.01); *H01L 2224/29347* (2013.01); *H01L 2224/29355* (2013.01); *H01L 2224/29357* (2013.01); *H01L 2224/29364* (2013.01); *H01L 2224/32225* (2013.01); *H01L 2224/83203* (2013.01); *H01L 2924/2075* (2013.01); *H05K 2201/09945* (2013.01); *H05K 2203/0278* (2013.01)

(56) References Cited

U.S. PATENT DOCUMENTS

| | | | | |
|---|---|---|---|---|
| 8,152,953 | B2* | 4/2012 | Yoshimura | H05K 3/321 |
| | | | | 156/327 |
| 9,093,196 | B2* | 7/2015 | Hashiba | C08J 3/12 |
| 10,173,924 | B2* | 1/2019 | Moireau | C03C 25/44 |
| 2006/0100314 | A1* | 5/2006 | Arifuku | H01L 24/29 |
| | | | | 523/210 |
| 2008/0169349 | A1* | 7/2008 | Suzuki | H01L 27/1266 |
| | | | | 235/492 |
| 2010/0139747 | A1* | 6/2010 | Feng | B82Y 30/00 |
| | | | | 136/255 |
| 2011/0079799 | A1* | 4/2011 | Lee | C09J 7/20 |
| | | | | 257/91 |
| 2012/0261171 | A1* | 10/2012 | Yamada | C09J 7/10 |
| | | | | 174/255 |
| 2013/0154095 | A1* | 6/2013 | Yu | H01L 24/29 |
| | | | | 257/746 |
| 2014/0138828 | A1* | 5/2014 | Park | C09J 9/02 |
| | | | | 257/746 |
| 2014/0210084 | A1* | 7/2014 | Ko | C09J 9/02 |
| | | | | 257/746 |
| 2014/0254117 | A1* | 9/2014 | Roh | H05K 3/323 |
| | | | | 361/760 |
| 2015/0123292 | A1* | 5/2015 | Kim | H01L 24/27 |
| | | | | 257/783 |
| 2016/0143174 | A1* | 5/2016 | Cho | H05K 3/323 |
| | | | | 361/749 |
| 2019/0077930 | A1* | 3/2019 | Irie | C09C 1/027 |
| 2019/0260587 | A1* | 8/2019 | Xu | G06F 21/44 |

FOREIGN PATENT DOCUMENTS

| | | |
|---|---|---|
| JP | 2004-155957 A | 6/2004 |
| JP | 2012-164454 A | 8/2012 |
| JP | 2013-171656 A | 9/2013 |
| JP | 2013-182823 A | 9/2013 |
| JP | 2014-60150 A | 4/2014 |
| JP | 2015-195198 A | 11/2015 |
| JP | 2016-089153 A | 5/2016 |
| JP | 6187665 B1 | 8/2017 |
| KR | 10-2015-0048670 A | 5/2015 |

OTHER PUBLICATIONS

Dec. 26, 2017 Written Opinion of the International Searching Authority issued in International Patent Application No. PCT/JP2017/041684.

Mar. 1, 2019 International Preliminary Report on Patentability issued in International Patent Application No. PCT/JP2017/041684.

Dec. 26, 2017 Written Opinion of the International Preliminary Examining Authority issued in International Patent Application No. PCT/JP2017/041684.

Feb. 3, 2020 Chinese Office Action issued in Chinese Patent Application No. 201780071308.7.

Mar. 23, 2020 Office Action issued in Korean Patent Application No. 10-2019-7014344.

* cited by examiner (X-X Cross-Sectional View)

(X-X Cross-Sectional View)

(X-X Cross-Sectional View)

(X-X Cross-Sectional View)

ANISOTROPIC CONDUCTIVE FILM

TECHNICAL FIELD

The present invention relates to an anisotropic conductive film.

BACKGROUND ART

Anisotropic conductive films in which conductive particles are dispersed in an insulating resin layer are widely used for mounting electronic components such as IC chips. However, if an oxide film is formed on a surface of a terminal of the electronic component connected through the anisotropic conductive film, connection resistance becomes high. To cope with this, staving the oxide film using the conductive particles having different particle diameters to reduce the resistance (Patent Literature 1), using the hard conductive particles to make the conductive particles dig into wiring and increasing a connection area to reduce the resistance (Patent Literature 2), and the like have been proposed.

CITATION LIST

Patent Literature

Patent Literature 1: Japanese Patent Application Laid-Open No. 2013-182823
Patent Literature 2: Japanese Patent Application Laid-Open No. 2012-164454

SUMMARY OF INVENTION

Technical Problem

When the conductive particles having different particle diameters are used, as described in Patent Literature 1, the particles having the small diameters more likely dig into the terminal than the particles having the large diameters, but it is difficult to sufficiently reduce resistance thereby. Using the hard conductive particles, as described in Patent Literature 2, requires pressure bonding at high pressure at the time of anisotropic conductive connection, so that a connection structure formed of a substrate and an IC chip by the anisotropic conductive connection may have a deformation or a crack.

To prevent the occurrence of the deformation and the crack, there is a method in which the number of conductive particles is reduced. However, the reduction in the number of conductive particles causes a reduction in the number of captured conductive particles by the terminal, and therefore may result in an increase in resistance or an increase in conduction resistance after the connection.

Accordingly, an object of the present invention is to use high hardness conductive particles so as to allow connection with a terminal having an oxide film, and to ease a check of capture of the conductive particles by the terminal, as well as to enable pressure bonding in a low pressure condition, in order to reliably reduce resistance.

Solution to Problem

The present inventors have found out that the mixed use of conductive particles of different hardness concentrates contact pressure on the high hardness conductive particles at the time of anisotropic conductive connection, whereby the high hardness conductive particles stave an oxide film, and the low hardness conductive particles contribute to continuity using cracks formed in the oxide film by the high hardness conductive particles. Therefore, the present inventors have found out that even if the high hardness conductive particles have a reduced particle density, both of the high hardness conductive particles and the low hardness conductive particles contribute to continuity, thus resulting in a reduction in conduction resistance, that the reduction in the particle density of the high hardness conductive particles eliminates the need for performing pressure bonding at high pressure at the time of the anisotropic conductive connection, thus resolving the problem of the occurrence of a deformation or a crack in a connection structure, and that the mixed use of the high hardness conductive particles and the low hardness conductive particles eases observation of impressions of the conductive particles. The present inventors thereby have arrived at the present invention.

Namely, the present invention provides an anisotropic conductive film in which high hardness conductive particles having a 20% compression elastic modulus of 8000 to 28000 $N/mm^2$ and low hardness conductive particles having a lower 20% compression elastic modulus than that of the high hardness conductive particles are dispersed as conductive particles in an insulating resin layer, wherein the number density of all the conductive particles is 6000 particles/$mm^2$ or more, and the number density of the low hardness conductive particles is 10% or more of that of all the conductive particles.

Advantageous Effects of Invention

According to the anisotropic conductive connection of the present invention, even if an oxide film is formed on a surface of a terminal of an electronic component, the high hardness conductive particles dig into the oxide film, and the low hardness conductive particles contribute to continuity of the terminal owing to cracks formed in the oxide film by the high hardness conductive particles, so that it is possible to reduce conduction resistance.

Since the low hardness conductive particles are mixed into the high hardness conductive particles, it is possible to reduce a pressure bonding force required at the time of the anisotropic conductive connection as compared to a case in which the conductive particles are constituted of only the high hardness conductive particles. Therefore, it is possible to prevent the occurrence of a deformation or a crack in a connection structure on which the anisotropic conductive connection is made.

Furthermore, in the connection structure on which the anisotropic conductive connection is made, since both of impressions of the high hardness conductive particles and impressions of the low hardness conductive particles can be observed, and in particular, the impressions of the high hardness conductive particles can be clearly observed, the capture number of the conductive particles by the terminal can be evaluated with high accuracy. Accordingly, resistance can be reliably reduced.

DESCRIPTION OF EMBODIMENTS

Figure 1A:
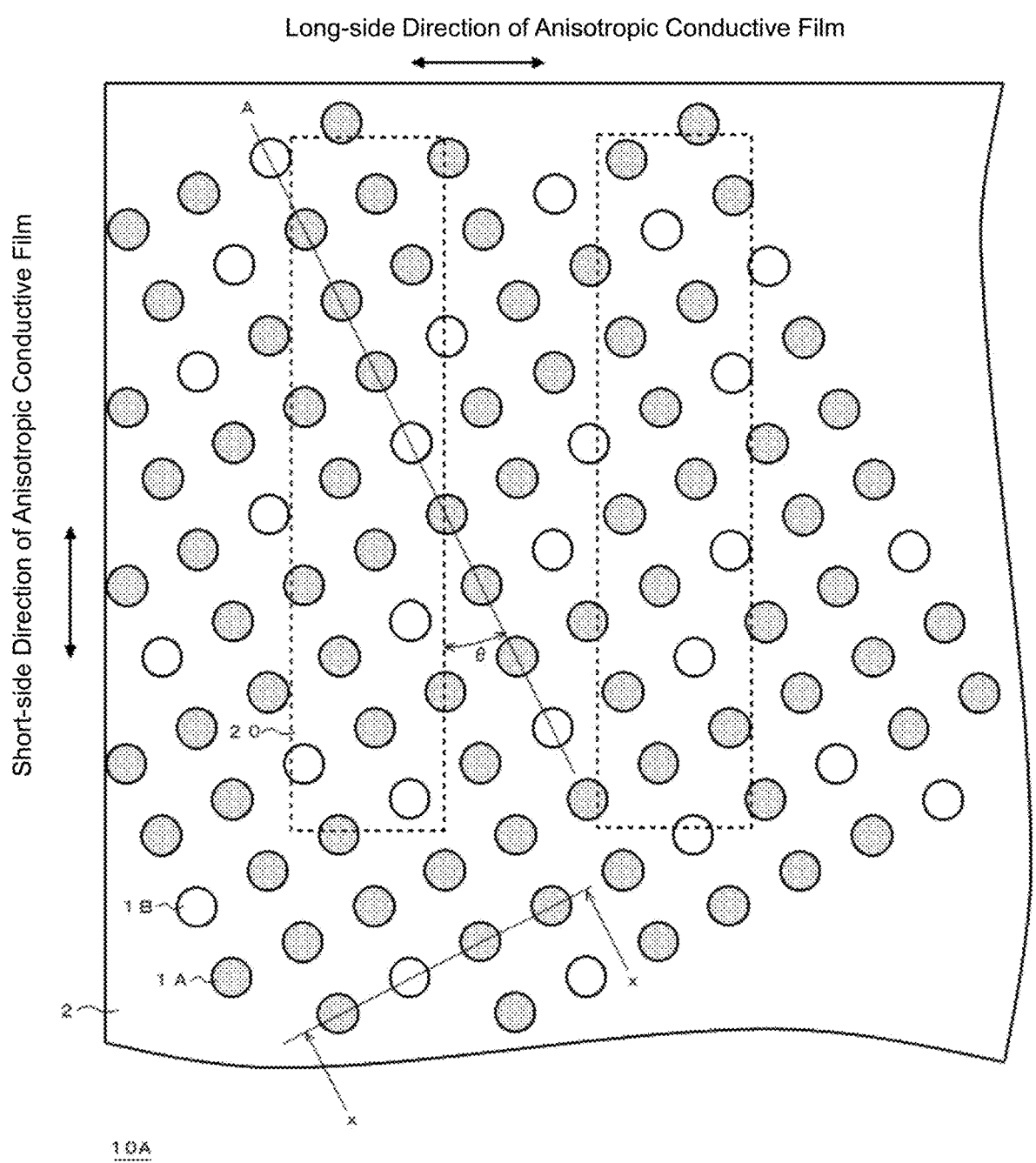
FIG. 1A is a plan view showing a disposition of conductive particles in an anisotropic conductive film 10A according to an example of the present invention.

An anisotropic conductive film of the present invention will be described below in detail with reference to the drawings. Note that the same reference numerals in the drawings denote the same or equivalent components.

<Whole Structure of Anisotropic Conductive Film>

Figure 1B:
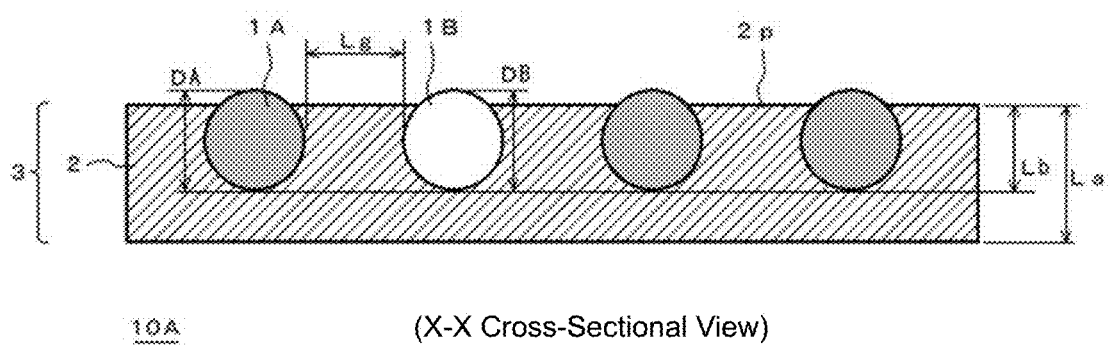
FIG. 1B is a cross-sectional view of the anisotropic conductive film 10A according to the example.

FIG. 1A is a plan view that illustrates the disposition of conductive particles 1A and 1B in an anisotropic conductive film 10A according to an example of the present invention. FIG. 1B is a cross-sectional view taken along line x-x of the anisotropic conductive film 10A.

The anisotropic conductive film 10A is formed of a conductive particle dispersed layer 3 in which both of high hardness conductive particles 1A having a 20% compression elastic modulus of 8000 to 28000 N/mm² and low hardness conductive particles 1B having a lower 20% compression elastic modulus than that of the high hardness conductive particles 1A are dispersed in an insulating resin layer 2. The number density of all the conductive particles, including the high hardness conductive particles 1A and the low hardness conductive particles 1B, is 6000 particles/mm² or more, and the number density of the low hardness conductive particles 1B occupies 10% or more of that of all the conductive particles. The conductive particles are arranged in a square lattice form as a whole, but there is no regularity as to which of the high hardness conductive particle 1A and the low hardness conductive particle 1B is located in each lattice point.

<Conductive Particles>

In the conductive particle dispersed layer 3, both of the high hardness conductive particles 1A and the low hardness conductive particles 1B are present as conductive particles. Of these, the high hardness conductive particle 1A has the 20% compression elastic modulus of 8000 to 28000 N/mm².

Herein, a 20% compression elastic modulus may be a K value obtained by measuring a compression variation of a conductive particle at the time of applying a compression load to the conductive particle using a micro compression tester (for example, FISCHERSCOPE H-100 manufactured by Fischer Instruments K.K.), and calculating the K value as the 20% compression elastic modulus from the equation:

20% compression elastic modulus ($K$) (N/mm²)=(3/$2^{1/2}$)·$F$·$S^{-3/2}$·$R^{-1/2}$ wherein, F: a load value (N) when the conductive particle is compressed and deformed by 20%, S: a compression displacement when the conductive particle is compressed and deformed by 20%, and R: the radius (mm) of the conductive particle.

When the high hardness conductive particles have a 20% compression elastic modulus of 8000 N/mm² or more, even if an oxide film is formed on a surface of a terminal of an electronic component, the high hardness conductive particles can stave the oxide film. When the high hardness conductive particles have a 20% compression elastic modulus of 28000 N/mm² or less, a pressure bonding force required at the time of anisotropic conductive connection does not excessively increase, and therefore it becomes possible to make the anisotropic conductive connection using an existing pressing jig.

The particle diameter of the high hardness conductive particle 1A is preferably 1 μm or more and 30 μm or less, and more preferably 3 μm or more and less than 10 μm, in order to prevent an increase in conduction resistance and prevent the occurrence of a short circuit. The particle diameters of the conductive particles before being dispersed in the insulating resin layer can be measured by a general particle size distribution measurement apparatus, and an average particle diameter can also be measured using the particle size distribution measurement apparatus. The measurement apparatus may be of an imaging type or a laser type. As the imaging type measurement device, there is, for example, a wet dynamic flow particle size and shape analyzer FPIA-3000 (Malvern Panalytical Ltd.). The number of samples (the number of conductive particles) used for measurement of an average particle diameter D is preferably 1000 or more. The particle diameters of the conductive particles in the anisotropic conductive film can be measured by observation using an electron microscope such as a SEM. In this case, the number of samples used for measurement of an average particle diameter is desirably 200 or more.

Note that, in the case of using conductive particles to the surfaces of which insulating fine particles are attached, the particle diameter of the conductive particle in the present invention means a particle diameter that does not include the insulating fine particles attached to its surface.

On the other hand, the low hardness conductive particles 1B have a lower 20% compression elastic modulus than that of the high hardness conductive particles, which is preferably 10% or more and 70% or less of the 20% compression elastic modulus of the high hardness conductive particles. If the 20% compression elastic modulus of the low hardness conductive particles is too low, the low hardness conductive particles are hard to contribute to continuity. If the 20% compression elastic modulus of the low hardness conductive particles are too high, the difference in hardness between the high hardness conductive particles and the low hardness conductive particles is insufficient, thus being unable to exert the effects of the present invention.

The particle diameter of the low hardness conductive particle 1B is preferable 1 μm or more and 30 μm or less, and is of practical use as long as it is 80% or more of the particle diameter of the high hardness conductive particle, but is preferably equal or more. When the particle diameter of the low hardness conductive particle is equal to or more than the particle diameter of the high hardness conductive particle, the low hardness conductive particles easily contribute to continuity using cracks formed in the oxide films of the surfaces of the terminals by the high hardness conductive particles.

The high hardness conductive particles 1A and the low hardness conductive particles 1B having the above hardnesses and particle diameters can be appropriately selected from conductive particles used in well-known anisotropic conductive films. Examples of such conductive particles may include metal particles of nickel, cobalt, silver, copper, gold, palladium or the like, alloy particles of solder, metal-coated resin particles, and metal-coated resin particles to the surfaces of which insulating fine particles are attached. In the metal-coated resin particle, the thickness of a metal layer is preferably 50 nm to 250 nm. The conductive particle may have projections on its surface. In the case of the metal-coated resin particle, particles described in Japanese Patent Application Laid-Open No. 2016-89153 may be used.

<Number Density of Conductive Particles>

The number density of the low hardness conductive particles 1B is 10% or more of all the conductive particles, and can be appropriately adjusted according to the type of connected terminals and connection conditions. As an example, the number density of the low hardness conductive particles is preferably 20% or more and 80% or less, and more preferably 30% or more and 70% or less. If the number density of the low hardness conductive particles, relative to all the conductive particles, is too low or too high, the effects of the present invention, owing to the mixed use of the high hardness conductive particles and the low hardness conductive particles, cannot be sufficiently obtained.

The number density of all the conductive particles is not specifically limited, but, by way of example, when the average particle diameter D of all the conductive particles 1A and 1B is less than 10 the number density of all the conductive particles is preferably 6000 particles/mm$^2$ or more and 42000 particles/mm$^2$ or less. When the average particle diameter is 10 μm or more, the number density of all the conductive particles is not limited within this range. As an example, the number density of all the conductive particles is between 20 particles/mm$^2$ or more and 2000 particles/mm$^2$ or less.

When the average particle diameter D of all the conductive particles 1A and 1B is less than 10 if the number density of all the conductive particles is too high, the area occupancy rate of the conductive particles calculated by the following equation becomes too high.

Area occupancy rate=[number density of conductive particles in a plan view (particles/mm$^2$)]×[average area of one conductive particle in a plan view (mm$^2$/particle)]×100

The area occupancy rate is used as an index of a thrust required of the pressing jig to bond the anisotropic conductive film to the electronic component by thermocompression bonding. When the area occupancy rate is preferably set at 35% or less, and more preferably in the range of 0.3% to 30%, it is possible to suppress the thrust required of the pressing jig to bond the anisotropic conductive film to the electronic component by the thermocompression bonding.

Note that the number density of the conductive particles can be measured using an observation image by a metallographic microscope or the like. It may be determined by measurement of the observation image using an image analysis software (for example, WinROOF available from MITANI Corporation or the like). As measurement regions to determine the number density of the conductive particles, rectangular regions the side of which is 100 μm or more are set at a plurality of arbitrary positions (preferably 5 positions or more and more preferably 10 positions or more), and a total area of the measurement regions is preferably 2 mm$^2$ or more. The size of each region and the number of the regions may be appropriately adjusted according to the state of the number density. The average of the area of one conductive particle in a plan view can be calculated by measurement of an observation image of a film surface by an electron microscope such as a metallographic microscope or an SEM, or the like. Image analysis software may also be used. An observation method and a measurement method are not limited to the above-described methods.

The inter-particle distance Lg of all the conductive particles 1A and 1B is appropriately set according to the predetermined number density and particle disposition, provided that the above-described area occupancy rate of the conductive particles 1A and 1B can be achieved.

<Disposition of Conductive Particles>

In the anisotropic conductive film according to the present invention, all the conductive particles including the high hardness conductive particles 1A and the low hardness conductive particles 1B may be disposed regularly or at random, in a plan view. As examples of the regular disposition, there is a lattice arrangement including a hexagonal lattice, a rhombic lattice, a rectangular lattice and the like, in addition to a square lattice illustrated in FIG. 1A. As the particle disposition of all the conductive particles, particle rows in which the conductive particles 1A or 1B are linearly aligned at predetermined intervals may be arranged side by side at predetermined intervals. In the present invention, the regular disposition is not specifically limited, as long as the disposition is repeated in a longitudinal direction of the film.

Figure 2A:
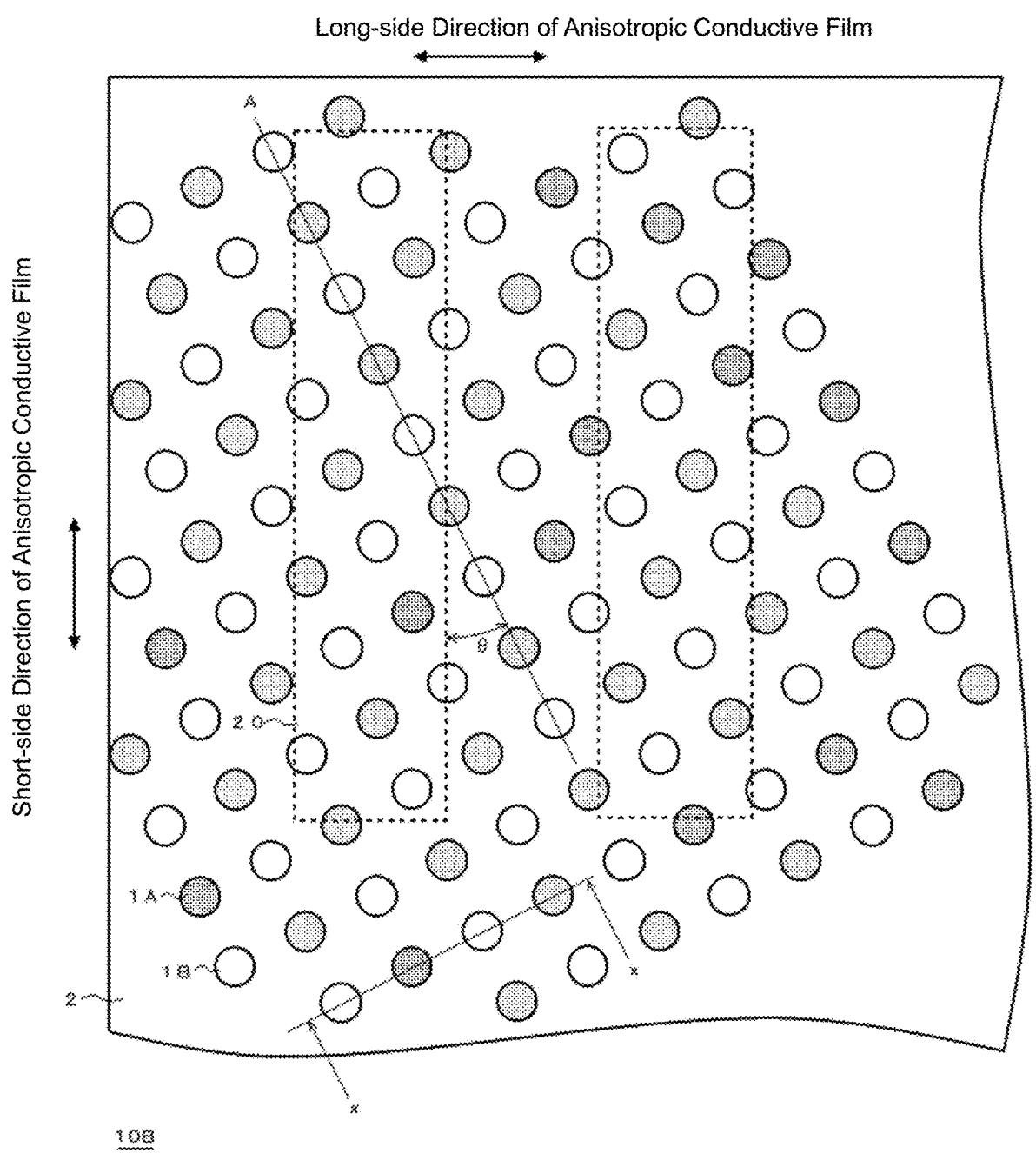
FIG. 2A is a plan view showing a disposition of conductive particles in an anisotropic conductive film 10B according to an example of the present invention.
Figure 2B:
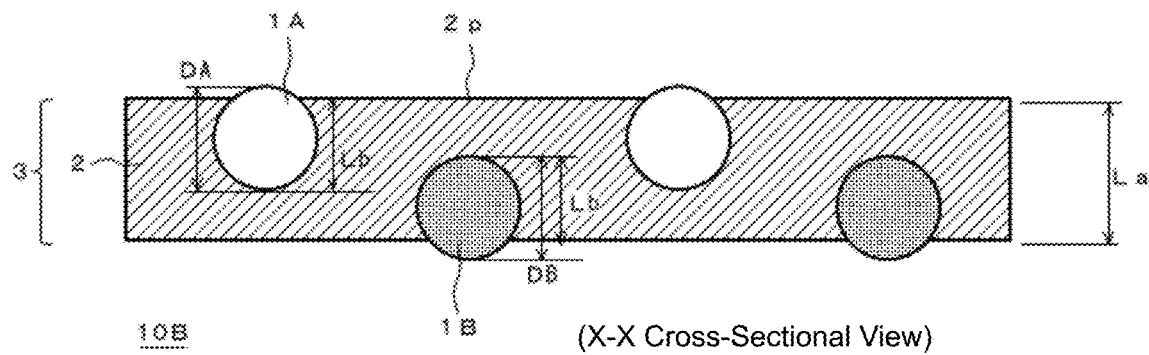
FIG. 2B is a cross-sectional view of the anisotropic conductive film 10B according to the example.

On the other hand, the high hardness conductive particles 1A may be regularly disposed, while the low hardness conductive particles 1B may be regularly disposed. For example, as in the case of an anisotropic conductive film 10B illustrated in FIGS. 2A and 2B, the number density of the low hardness conductive particles 1B is 50% of all the conductive particles, and the high hardness conductive particles 1A may be arranged in a square lattice form, while the low hardness conductive particles 1B may be arranged in another square lattice form. The high hardness conductive particles 1A and the low hardness conductive particles 1B are alternately disposed in FIG. 2A, but the present invention encompasses both such neat disposition and other non-neat disposition.

When there is a lattice axis or an arrangement axis in the particle arrangement of all the conductive particles, the lattice axis of the arrangement axis may be in parallel with the longitudinal direction of the anisotropic conductive film 10A, or may intersect with the longitudinal direction of the anisotropic conductive film, and it can be determined according to the widths of the terminals to be connected, the pitches of the terminals, and the like. For example, in the case of the anisotropic conductive film for a fine pitch, as illustrated in FIG. 1A, at least one lattice axis A of the conductive particles 1A and 1B is preferably diagonal to the longitudinal direction of the anisotropic conductive film 10A, and the angle θ formed between the longitudinal direction of a terminal 20 to be connected with the anisotropic conductive film 10A and the lattice axis A is preferably set at 16° to 74°.

The conductive particles 1A and 1B are preferably present without being in contact with each other in a plan view of the film, and the conductive particles 1A and 1B are preferably present without overlapping each other in a film thickness direction. Accordingly, the proportion of number of the conductive particles 1A and 1B that are present without being in contact with each other, with respect to all the conductive particles, is 95% or more, preferably 98% or more, and more preferably 99.5% or more. The same goes for both of the regular disposition and the random disposition. As described later, the conductive particles 1A and 1B are preferably disposed in a regular manner using a transfer mold, because the ratio at which the conductive particles 1A and 1B are present without being in contact with each other can be easily controlled. In the case of the random disposition, since the anisotropic conductive film can be easily produced by mixing and kneading the conductive particles 1A and 1B into an insulating resin, either a production method using the transfer mold or a production method using mixing and kneading can be selected by a tradeoff between performance and cost.

When the conductive particles 1A and 1B are present without being in contact with each other, the positions of the conductive particles 1A and 1B are preferably made uniform in a film thickness direction. For example, when the high hardness conductive particles 1A and the low hardness conductive particles 1B have the same particle diameter, as shown in FIG. 1B, the conductive particles 1A and 1B may have the same embedded amount Lb in the film thickness direction. In other words, owing to a uniform distance from one of interfaces of the insulating resin layer 2, the conductive particle capturing properties by the terminal is easily stabilized.

Figure 3:
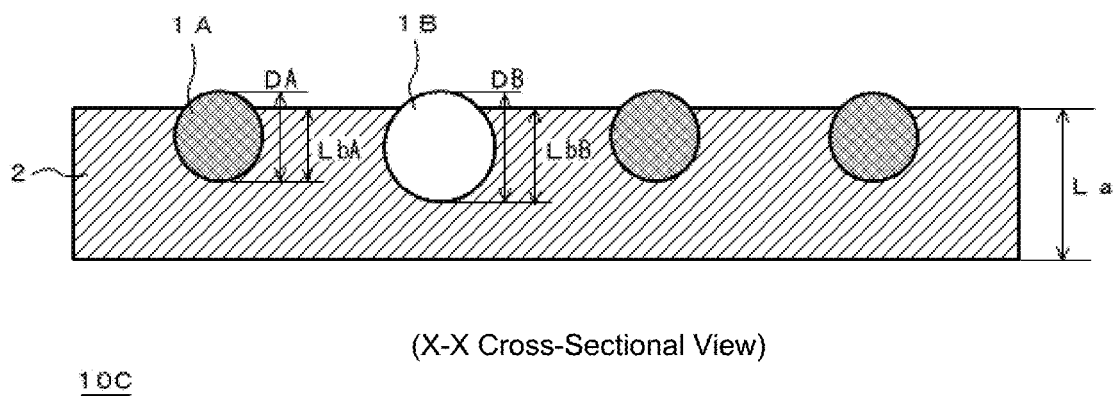
FIG. 3 is a cross-sectional view of the anisotropic conductive film 10C according to an example.

When the high hardness conductive particles 1A and the low hardness conductive particles 1B have different particle diameters, equalizing the distances between a surface of the insulating resin layer 2 and the conductive particle 1A and between the surface of the insulating resin layer 2 and the conductive particle 1B, by embedding the conductive particles 1A and 1B in the insulating resin layer 2, allows easy stabilization of the conductive particle capturing properties at the terminals owing to the same reason as above. On the other hand, as illustrated in FIG. 3, when the conductive particles 1A and 1B are exposed from the insulating resin layer 2, the position of a top of each conductive particle of the conductive particles 1A and 1B exposed from the insulating resin layer 2 may be made uniform in a film thickness direction. The relationship of a ratio (La/D) between the layer thickness La of the insulating resin layer 2 and the average particle diameter D of the conductive particles 1A and 1B will be described later.

In either of cases where the high hardness conductive particles 1A and the low hardness conductive particles 1B have the same diameter or different diameters, if the conductive particles 1A and 1B are exposed from the insulating resin layer 2, a pressure applied at the time of connection is easily transferred to the conductive particles 1A and 1B. More specifically, taking metal-coated resin particles as an example, as with the function of concaves 2b and 2c described later, when the conductive particles 1A and 1B are exposed from the insulating resin layer 2, the resistance of the insulating resin layer 2 against deformation of the metal-coated resin particles, which occurs by pushing the metal-coated resin particles by a pressing jig at the time of the anisotropic conductive connection, is reduced and therefore impressions after the connection tend to have a uniform state. This facilitates checking a state after the connection.

The embedded amount Lb refers to the distance between a surface of the insulating resin layer 2 in which the conductive particles 1A and 1B are embedded (out of front and rear surfaces of the insulating resin layer 2, a surface on which the conductive particles 1A and 1B are exposed, or when the conductive particles 1A and 1B are completely embedded in the insulating resin layer 2, a surface that is nearer to the conductive particles 1A and 1B) that is a tangential plane 2p in the center portion between adjacent conductive particles and the deepest portion of the conductive particle 1A or 1B. When an embedded rate (Lb/D) refers to the ratio of the embedded amount Lb to the average particle diameter D of the conductive particles 1A and 1B, the embedded rate is preferably 30% or more and 105% or less.

When the embedded rate (Lb/D) is set at 30% or more and less than 60%, the conductive particles are exposed at a high ratio from a relatively high-viscosity resin for holding the conductive particles, thus facilitating mounting at lower pressure. Setting the embedded rate (Lb/D) at 60% or more facilitates maintaining the conductive particles 1A and 1B in a predetermined particle dispersion state or predetermined positions by the insulating resin layer 2. Setting the embedded rate (Lb/D) at 105% or less allows a reduction in the amount of a resin of the insulating resin layer, which acts to cause the conductive particles between terminals to flow unnecessarily at the time of the anisotropic conductive connection. Note that the conductive particles 1A and 1B may just penetrate the insulating resin layer 2, and the embedded rate (Lb/D) is 100% in that case.

Note that, in the present invention, the numerical value of the embedded rate (Lb/D) means that 80% or more, preferably 90% or more, and more preferably 96% or more of all the conductive particles contained in the anisotropic conductive film have the value of the embedded rate (Lb/D). Accordingly, the embedded rate of 30% or more and 105% or less means that 80% or more, preferably 90% or more, and more preferably 96% or more of all the conductive particles contained in the anisotropic conductive film have the embedded rate of 30% or more and 105% or less. Since the embedded rates (Lb/D) of all the conductive particles are uniform in this manner, the pressing load is uniformly applied to the conductive particles, so that the conductive particle-capturing state at the terminals becomes favorable, and high conduction reliability can be expected. To increase precision, the embedded rate (Lb/D) may be determined by measurement of 200 or more conductive particles.

The measurement of the embedded rate (Lb/D) can be determined in batches of a certain number of conductive particles by adjustment of a focus in a surface field image. Otherwise, a laser type discrimination sensor (manufactured by Keyence Corporation or the like) may be used for measurement of the embedded rate (Lb/D).

<Insulating Resin Layer>
(Viscosity of Insulating Resin Layer)

In the anisotropic conductive film according to the present invention, the minimum melt viscosity of the insulating resin layer 2 is not specifically limited, and is appropriately determined according to the use application of the anisotropic conductive film, a method for producing the anisotropic conductive film and the like. For example, depending on the method for producing the anisotropic conductive film, the minimum melt viscosity may be on the order of 1000 Pa·s, as long as later-described concaves 2b (FIG. 4) and 2c (FIG. 5) can be formed. On the other hand, as the method for producing the anisotropic conductive film, a method in which conductive particles are held in predetermined disposition on a surface of an insulating resin layer and then the conductive particles are pushed into the insulating resin layer is adopted, the minimum melt viscosity of the insulating resin layer is preferably set to be 1100 Pa·s or more, from the viewpoint of allowing molding a film of the insulating resin layer.

Figure 4:
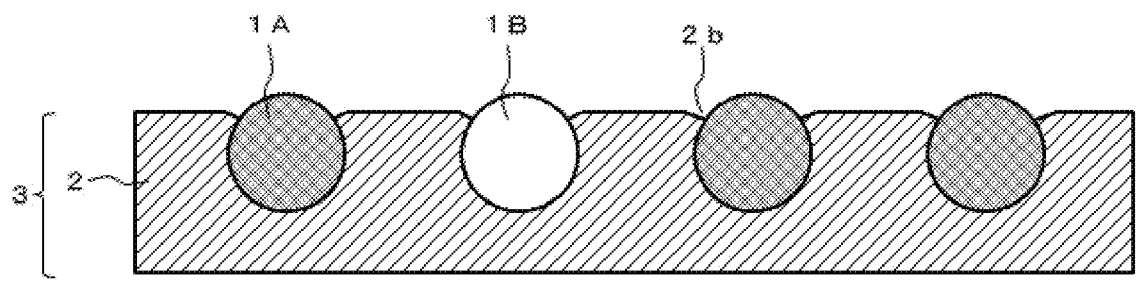
FIG. 4 is a cross-sectional view of the anisotropic conductive film 10D according to an example.
Figure 5:
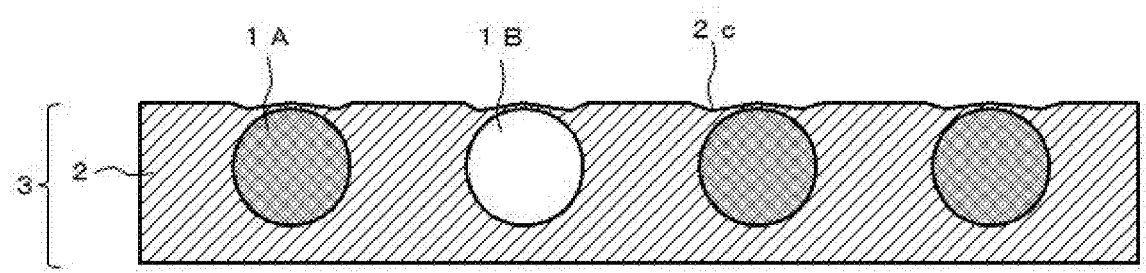
FIG. 5 is a cross-sectional view of the anisotropic conductive film 10E according to an example.

As described later in the method for producing the anisotropic conductive film, considering that concaves 2b are formed around exposure portions of the conductive particles 1A and 1B pushed into the insulating resin layer 2, as illustrated in FIG. 4, and concaves 2c are formed right above the conductive particles 1A and 1B pushed into the insulating resin layer 2, as illustrated in FIG. 5, the minimum melt viscosity is preferably 1500 Pa·s or more, more preferably 2000 Pa·s or more, further more preferably 3000 Pa·s to 15000 Pa·s, and still further more preferably 3000 Pa·s to 10000 Pa·s. The minimum melt viscosity may be measured by, for example, a rotational rheometer (manufactured by TA instruments) with a constant measurement pressure of 5 g with the use of a measurement plate of a diameter of 8 mm, and more specifically can be measured in a temperature range of 30 to 200° C., at a temperature increase rate of 10° C./minute, at a measurement frequency of 10 Hz, with a load variation of 5 g against the measurement plate.

By setting the minimum melt viscosity of the insulating resin layer 2 at a high level of 1500 Pa·s or more, it is possible to suppress unnecessary movement of the conductive particles in pressure bonding of the anisotropic conductive film to an article, and more specifically it is possible to prevent the conductive particles to be held between the terminals from flowing due to the resin flow at the time of the anisotropic conductive connection.

In the case of forming the conductive particle dispersed layer 3 of the anisotropic conductive film 10A by pushing the conductive particles 1A and 1B into the insulating resin layer 2, the insulating resin layer 2 at the time of pushing the conductive particles 1A and 1B is a viscous body having a high viscosity such that, when the conductive particles 1A and 1B are pushed into the insulating resin layer 2 so as to expose the conductive particles 1A and 1B from the insulating resin layer 2, the insulating resin layer 2 is plastically deformed and the concaves 2b (FIG. 4) are formed in the surface of the insulating resin layer 2 around the conductive particles 1A and 1B, or is a viscous body having a high viscosity such that, when the conductive particles 1A and 1B are pushed into the insulating resin layer 2 such that the conductive particles 1A and 1B are embedded in the insulating resin layer 2 without being exposed from the insulating resin layer 2, the concaves 2c (FIG. 5) are formed in the surface of the insulating resin layer 2 right above the conductive particles 1A and 1B. Therefore, the viscosity of the insulating resin layer 2 at 60° C. has a lower limit of preferably 3000 Pa·s or more, more preferably 4000 Pa·s or more, and further more preferably 4500 Pa·s, and an upper limit of preferably 20000 Pa·s or less, more preferably 15000 Pa·s or less, and further more preferably 10000 Pa·s or less. This measurement is performed by the same measurement method as that for the minimum melt viscosity, by extracting a value at a temperature of 60° C.

The concrete viscosity of the insulating resin layer 2 at the time of pushing the conductive particles 1A and 1B into the insulating resin layer 2 has a lower limit of preferably 3000 Pa·s or more, more preferably 4000 Pa·s or more, and further more preferably 4500 Pa·s or more, and an upper limit of preferably 20000 Pa·s or less, more preferably 15000 Pa·s or less, and further more preferably 10000 Pa·s or less, in accordance with the shapes, depths and the like of the concaves 2b and 2c to be formed. Such viscosity can be exhibited preferably at 40° C. to 80° C., and more preferably at 50° C. to 60° C.

As described above, since the concaves 2b (FIG. 4) are formed around the conductive particles 1A and 1B exposed from the insulating resin layer 2, a resistance received from the insulating resin layer against flattening of the conductive particles 1A and 1B, when the anisotropic conductive film is pressure bonded to an article, is reduced, as compared to the case of having no concaves 2b. Therefore, since the terminals easily hold the conductive particles at the time of the anisotropic conductive connection, conduction performance is improved and the capturing properties are improved.

Since the concaves 2c (FIG. 5) are formed in the surface of the insulating resin layer 2 right above the conductive particles 1A and 1B that are embedded in the insulating resin layer 2 without being exposed therefrom, a pressure at the time of pressure bonding of the anisotropic conductive film to the article tends to concentrate on the conductive particles 1A and 1B, as compared to the case of having no concaves 2c. Therefore, since the terminals easily hold the conductive particles at the time of the anisotropic conductive connection, capturing properties are improved and conduction performance is also improved.

<"Inclination" or "Undulation" Instead of Concave>

The "concave" 2b and 2c of the anisotropic conductive film as shown in FIGS. 4 and 5 can also be described in terms of "inclination" or "undulation". A description thereof will next be given with reference to FIGS. 8 to 15.

Figure 8:
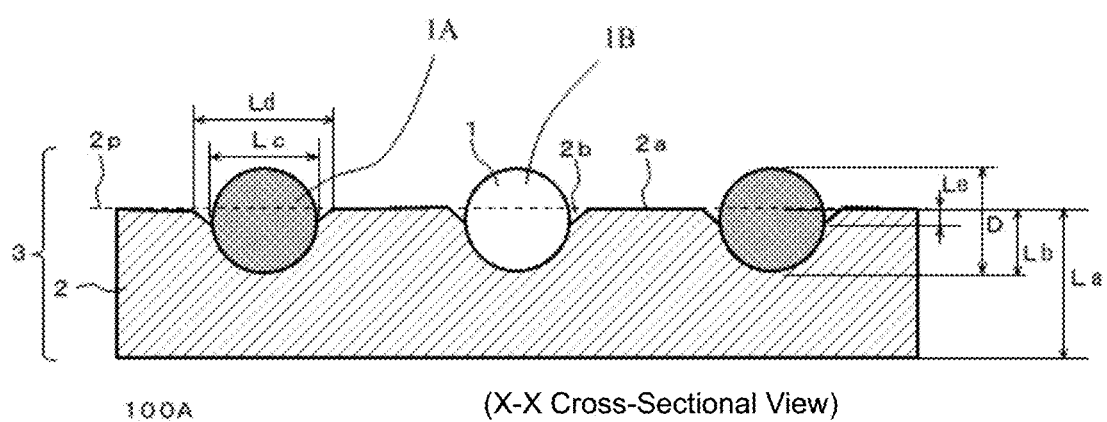
FIG. 8 is a cross-sectional view of the anisotropic conductive film 100A according to an example.

The anisotropic conductive film 100A is constituted of a conductive particle dispersed layer 3 (FIG. 8). In the conductive particle dispersed layer 3, the high hardness conductive particles 1A and the low hardness conductive particles 1B are regularly dispersed in a state where they are exposed from one surface of the insulating resin layer 2. In a plan view of the film, the conductive particles 1A and 1B are not in contact with each other, and the conductive particles 1A and 1B are regularly dispersed without overlapping with each other in the film thickness direction, so that they constitute a single conductive particle layer in which the positions of the conductive particles 1A and 1B in the film thickness direction are uniform.

Figure 11:
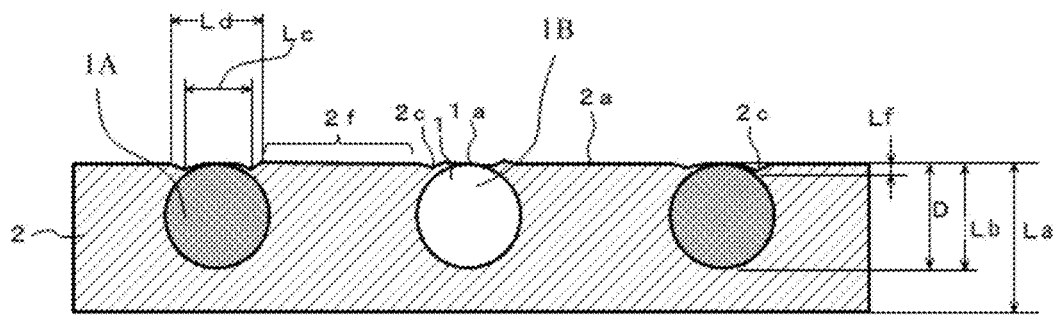
FIG. 11 is a cross-sectional view of the anisotropic conductive film 100D according to an example.
Figure 13:
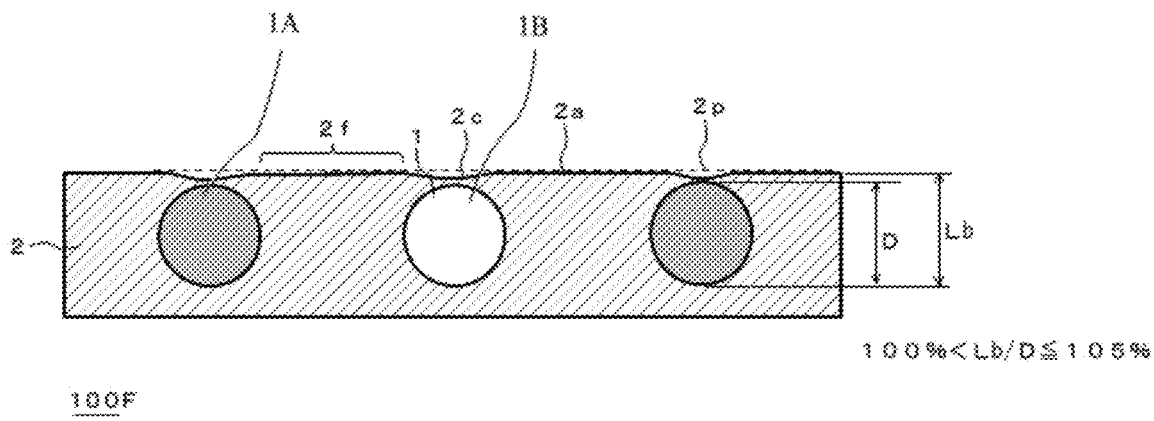
FIG. 13 is a cross-sectional view of the anisotropic conductive film 100F according to an example.

An inclination 2b is formed on the surface 2a of the insulating resin layer 2 around the conductive particle 1A, 1B with respect to the tangential plane 2p of the insulating resin layer 2 in the center portion between adjacent conductive particles. As will be described later, in the anisotropic conductive film of the present invention, an undulation 2c may be formed on the surface of the insulating resin layer right above the conductive particle 1A, 1B embedded in the insulating resin layer 2 (FIG. 11 and FIG. 13).

The term "inclination" used in the present invention means a state in which the flatness of the surface of the insulating resin layer is impaired near the conductive particle 1A, 1B, and a part of the resin layer is lacked with respect to the tangential plane 2p to reduce the resin amount thereby. In other words, the surface of the insulating resin layer around the conductive particle in the inclination is lacked with respect to the tangential plane. On the other hand, the term "undulation" used herein means a state in which a waviness is generated on the surface of the insulating resin layer right above the conductive particle, and the resin amount is reduced by the presence of a portion with a height difference such as a waviness. In other words, the amount of the resin in the insulating resin layer right above the conductive particle is smaller than that when the surface of the insulating resin layer right above the conductive particle is flush with the tangential plane. These can be seen by comparing the portions of the flat surfaces (2f in FIG. 11 and FIG. 13) between the conductive particles with the portions corresponding to the position right above the conductive particles. It should be noted that the starting point of the undulation may be present as an inclination.

As described above, the formation of the inclination 2b (FIG. 8) around the conductive particle 1A, 1B exposed from the insulating resin layer 2 reduces the resistance received from the insulating resin due to the flattening of the conductive particle 1A, 1B that occurs when the conductive particle 1A, 1B is sandwiched between the terminals at the time of anisotropic conductive connection, compared to the case of having no inclination 2b. Thus, since the conductive particles are easily sandwiched by the terminals, the conduction performance and also the capturing properties are improved. The inclination preferably follows the contour of the conductive particles. This is because, in addition to the fact that the effect in connection is more likely to be exhibited, it becomes easier to carry out a test or the like in the production of the anisotropic conductive film by making it easier to recognize the conductive particles. The inclination and undulation may be partially lost by heat pressing the insulating resin layer, but the present invention encompasses this case. In this case, the conductive particle may be exposed at one point on the surface of the insulating resin layer. There are various electronic components to be connected by the anisotropic conductive film, and as long as tuning is performed according to these, it is desired that the degree of freedom of design be high so as to satisfy various requirements. Therefore, the anisotropic conductive film can be used even if the inclination or undulation is reduced or partially disappeared.

In addition, since the undulation 2c (FIG. 11 and FIG. 13) is formed on the surface of the insulating resin layer 2 right above the conductive particle 1A, 1B which is embedded without being exposed from the insulating resin layer 2, the pressing force from the terminals tends to be applied to the conductive particle at the time of the anisotropic conductive connection, similarly to the case of the inclination. In addition, since the amount of the resin right above the conductive particle is reduced due to the presence of the undulation compared to the case where the resin is deposited flat, the resin right above the conductive particle is easily removed at the time of connection, and the terminals and the conductive particle easily come into contact with each other, so that the conductive particle capturing properties at the terminals are improved, and the conduction reliability is improved.

(Positions of Conductive Particles in the Thickness Direction of the Insulating Resin Layer)

Although the positions of the conductive particles 1A and 1B in the thickness direction of the insulating resin layer 2 when considering the viewpoint of "inclination" or "undulation" may be such that the conductive particles 1A and 1B are exposed from the insulating resin layer 2, or may be embedded in the insulating resin layer 2 without being exposed, as described above, it is preferable that the ratio (Lb/D) (embedded rate) between the distance Lb (hereinafter referred to as the embedded amount) of the deepest portion of the conductive particles from the tangential plane 2p in the center portion between adjacent conductive particles and the average particle diameter D of the conductive particles be 30% or more and 105% or less.

When the embedded rate (Lb/D) is 30% or more, the predetermined particle dispersed state or predetermined disposition of the conductive particles 1A and 1B can be maintained by the insulating resin layer 2. When the embedded rate is 105% or less, the amount of the resin in the insulating resin layer which acts to cause the conductive particles between the terminals to flow unnecessarily at the time of anisotropic conductive connection can be reduced.

Note that the numerical value of the embedded rate (Lb/D) means that 80% or more, preferably 90% or more, and more preferably 96% or more of all the conductive particles contained in the anisotropic conductive film have the value of the embedded rate (Lb/D). Therefore, the embedded rate of 30% or more and 105% or less means that 80% or more, preferably 90% or more, and more preferably 96% or more of all the conductive particles contained in the anisotropic conductive film have the embedded rate of 30% or more and 105% or less. Since the embedded rates (Lb/D) of all the conductive particles are uniform in this manner, the pressing load is uniformly applied to the conductive particles, so that the conductive particle-capturing state at the terminals becomes favorable, and the conduction reliability is improved.

The embedded rate (Lb/D) can be determined by arbitrarily extracting 10 or more regions having an area of 30 $mm^2$ or more from the anisotropic conductive film, observing a part of a cross section of the film with the use of SEM images, and measuring 50 or more conductive particles. In order to improve the precision, 200 or more conductive particles may be measured to determine the embedded rate.

The measurement of the embedded rate (Lb/D) may be determined collectively for a certain number of particles by adjusting the focus in the surface field images. Alternatively, a laser type discrimination sensor (manufactured by Keyence Corporation or the like) may be used for measuring the embedded rate (Lb/D).

(Aspect of Embedded Rate of 30% or More and Less than 60%)

As a more specific embedded aspect of the conductive particles 1A and 1B having an embedded rate (Lb/D) of 30% or more and 60% or less, an aspect may be mentioned in which the conductive particles 1A and 1B are embedded at an embedded rate of 30% or more and less than 60% such that the conductive particles 1A and 1B are exposed from the insulating resin layer 2 as in the anisotropic conductive film 100A shown in FIG. 8. The anisotropic conductive film 100A has inclinations 2b in which portions of the surface of the insulating resin layer 2 in contact with the conductive particles 1A and 1B exposed from the insulating resin layer 2 and the vicinity thereof become ridge lines substantially along the outer shapes of the conductive particles with respect to the tangential plane 2p in the surface 2a of the insulating resin layer in the center portion between the adjacent conductive particles.

When the anisotropic conductive film 100A is produced by pushing the conductive particles 1A, 1B into the insulating resin layer 2, the inclinations 2b or the undulations 2c described later can be formed by pushing the conductive particles 1A and 1B into the insulating resin layer 2 at 40 to 80° C. at 3000 to 20000 Pa·s, more preferably 4500 to 15000 Pa·s.

(Aspect of Embedded Rate of 60% or More and Less than 100%)

As a more specific embedded aspect of the conductive particles 1A and 1B having an embedded rate (Lb/D) of 60% or more and less than 100%, an aspect may be mentioned in which the conductive particles 1A and 1B are embedded at an embedded rate of 60% or more and less than 100% such that the conductive particles 1A and 1B are exposed from the insulating resin layer 2 as in the anisotropic conductive film 100A shown in FIG. 8. The anisotropic conductive film 100A has inclinations 2b in which portions of the surface of the insulating resin layer 2 in contact with the conductive particles 1A and 1B exposed from the insulating resin layer 2 and the vicinity thereof become ridge lines substantially along the outer shapes of the conductive particles with respect to the tangential plane 2p in the surface 2a of the insulating resin layer in the center portion between the adjacent conductive particles.

When the anisotropic conductive film 100A is produced by pushing the conductive particles 1A and 1B into the insulating resin layer 2, the inclinations 2b or the undulations 2c described below are formed such that the lower limit of the viscosity at the time of pushing the conductive particles 1A and 1B is preferably 3000 Pa·s or more, more preferably 4000 Pa·s or more, and further preferably 4500 Pa·s or more, and the upper limit thereof is preferably 20000 Pa·s or less, more preferably 15000 Pa·s or less, and further preferably 10000 Pa·s or less. Such a viscosity can be exhibited preferably at 40° C. to 80° C., and more preferably at 50° C. to 60° C. Note that the inclinations 2b or the undulations 2c may be partially lost by heat pressing the insulating resin layer, the inclinations 2b may be transformed to the undulations 2c, and the conductive particles embedded in the insulating resin layer having the undulations 2c may be exposed from the insulating resin layer 2 at one point on the top thereof.

(Aspect of Embedded Rage of 100%)

Figure 9:
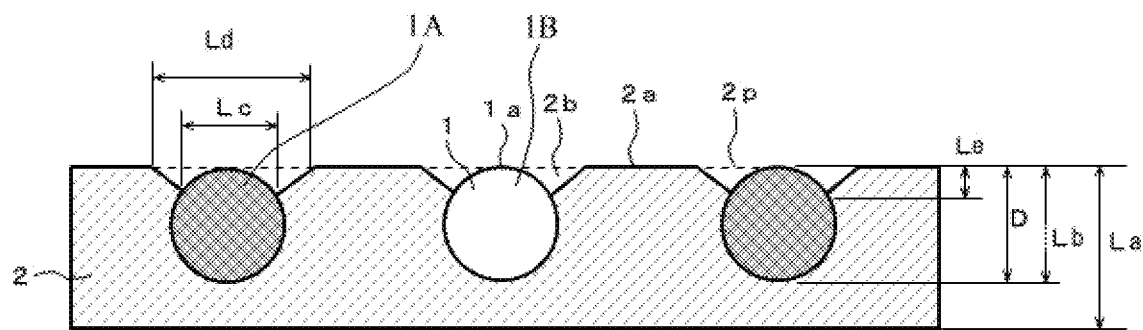
FIG. 9 is a cross-sectional view of the anisotropic conductive film 100B according to an example.
Figure 10A:
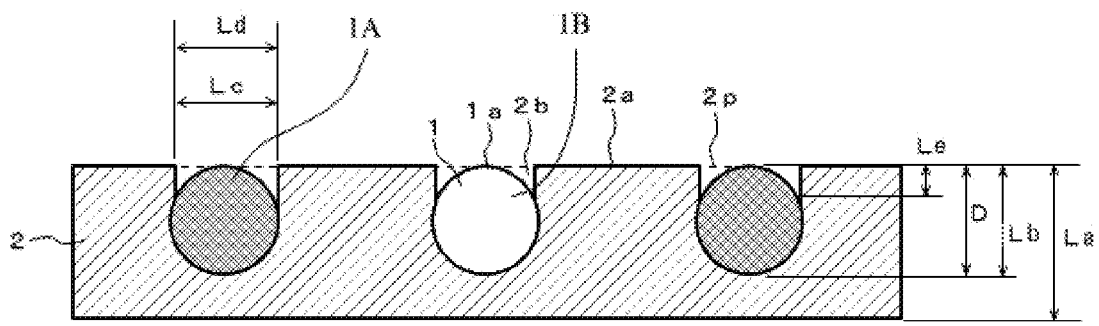
FIG. 10A is a cross-sectional view of the anisotropic conductive film 100C according to an example.

Next, as an aspect of the anisotropic conductive film of the present invention having an embedded rate (Lb/D) of 100%, there may be mentioned: an aspect like that of the anisotropic conductive film 100B shown in FIG. 9 which has inclinations 2b around the conductive particles 1A and 1B which become ridge lines substantially along the outer shapes of the conductive particles similar to the anisotropic conductive film 100A shown in FIG. 8, and the exposed diameter Lc of the conductive particles 1A and 1B exposed from the insulating resin layer 2 is smaller than the average particle diameter D of the conductive particles; an aspect like that of the anisotropic conductive film 100C shown in FIG. 10A in which inclinations 2b around the exposed portions of the conductive particles 1A and 1B appear abruptly near the conductive particles 1A and 1B and the exposed diameter Lc of the conductive particles 1A and 1B is substantially equal to the average particle diameter D of the conductive particles; and an aspect like that of the anisotropic conductive film 100D shown in FIG. 11 in which the surface of the insulating resin layer 2 has undulations 2c, and the conductive particles 1A, 1B are exposed from the insulating resin layer 2 at one point on the top 1a thereof.

Figure 10B:
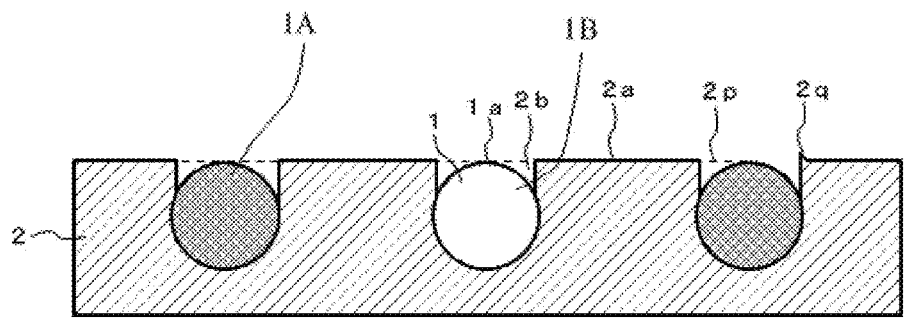
FIG. 10B is a cross-sectional view of the anisotropic conductive film 100C' according to an example.

In addition, a minute protruding portion 2q may be formed in the vicinity of the inclinations 2b of the insulating resin layer 2 around the exposed portions of the conductive particles or the undulations 2c of the insulating resin layer right above the conductive particles. One example thereof is shown in FIG. 10B.

Since these anisotropic conductive films 100B (FIG. 9), 100C (FIG. 10A), and 100D (FIG. 11) have an embedded rate of 100%, the top 1a of the conductive particle 1A, 1B and the surface 2a of the insulating resin layer 2 are flush with each other. When the top 1a of the conductive particle 1A, 1B and the surface 2a of the insulating resin layer 2 are flush with each other, the amount of the resin in the film thickness direction is less likely to be uneven around each of the conductive particles at the time of anisotropic conductive connection as compared to the case where the conductive particles 1A, 1B protrude from the insulating resin layer 2 as shown in FIG. 8. Thus, there is an effect that the movement of the conductive particles due to the resin flow can be reduced. Even when the embedded rate is not strictly 100%, this effect can be obtained if the top portion 1a of the conductive particle 1A, 1B embedded in the insulating resin layer 2 and the surface of the insulating resin layer 2 are substantially flush with each other. In other words, when the embedded rate (Lb/D) is approximately 80 to 105%, particularly 90 to 100%, the top portion 1a of the conductive particle 1A, 1B embedded in the insulating resin layer 2 and the surface of the insulating resin layer 2 can be considered as being flush with each other, and thus the movement of the conductive particles due to the resin flow can be reduced.

Among these anisotropic conductive films 100B (FIG. 9), 100C (FUG, 10A), and 100D (FIG. 11), since the amount of the resin around the conductive particles 1A and 1B is less likely to be uneven, the anisotropic conductive film 100D can prevent the movement of the conductive particles due to the resin flow. Furthermore, since the conductive particles 1A, 1B are exposed from the insulating resin layer 2 even at one point on the top 1a thereof, the properties of capturing the conductive particles 1A and 1B by the terminals is good, and it is expected to provide the effect in that the slight movement of the conductive particles is less likely to occur. Therefore, this aspect is effective particularly when the fine pitch is adopted or the inter-bump space is narrow.

The anisotropic conductive films 100B (FIG. 9), 100C (FIG. 10A), and 100D (FIG. 11), which differ in the shapes and depths of the inclination 2b and the undulation 2c, can be produced by changing the viscosity or the like of the insulating resin layer 2 when the conductive particles 1A and 1B are pushed in, as will be described later.

(Aspect of Embedded Rate Exceeding 100%)

Figure 12:
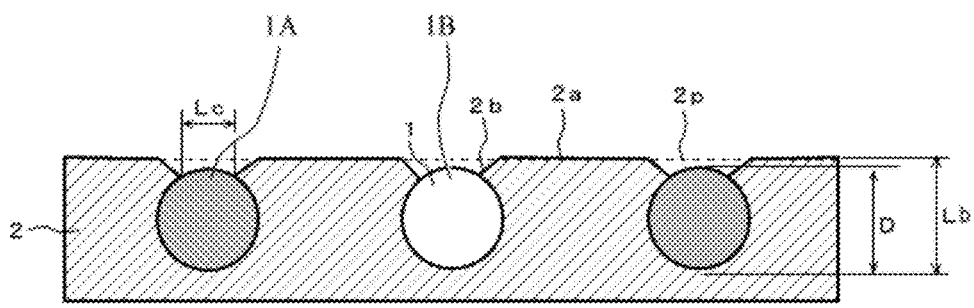
FIG. 12 is a cross-sectional view of the anisotropic conductive film 100E according to an example.

In the case of those having an embedded rate exceeding 100% among the anisotropic conductive films of the present invention, an aspect may be mentioned in which the conductive particles 1A and 1B are exposed as in the anisotropic conductive film 100 E shown in FIG. 12 and inclinations 2b around the exposed parts thereof with respect to the tangential plane 2p of the insulating resin layer 2 or an aspect may also be mentioned in which undulations 2c right above the conductive particles 1A, 1B with respect to the tangential plane 2p are present as in the anisotropic conductive film 100 F shown in FIG. 13.

Note that the anisotropic conductive film 100E (FIG. 12) having inclinations 2b in the insulating resin layer 2 around the exposed portions of the conductive particles 1A and 1B and the anisotropic conductive film 100F (FIG. 13) having undulations 2c in the insulating resin layer 2 right above the conductive particles 1A and 1B can be produced by changing the viscosity or the like of the insulating resin layer 2 when the conductive particles 1A and 1B are pushed in at the time of producing these.

When the anisotropic conductive film 100E shown in FIG. 12 is used for the anisotropic conductive connection, the conductive particles 1A and 1B are directly pressed from the terminal, so that the conductive particle capturing properties at the terminals are improved. When the anisotropic conductive film 100F shown in FIG. 13 is used for anisotropic conductive connection, the conductive particles 1A and 1B do not directly press the terminals but press the terminals through the insulating resin layer 2. In this case, the amount of the resin existing in the pressing direction is smaller than that in the state shown in FIG. 15 (i.e., the state in which the conductive particles 1A and 1B are embedded with an embedded rate exceeding 100%, the conductive particles 1A and 1B are not exposed from the insulating resin layer 2, and the surface of the insulating resin layer 2 is flat). Therefore, the pressing force tends to be applied to the conductive particles, and the conductive particles 1A and 1B between the terminals are prevented from moving unnecessarily by the resin flow at the time of anisotropic conductive connection.

From the viewpoint of easily obtaining the aforementioned effects of the inclinations 2b (FIGS. 8, 9, 10A, and 12) of the insulating resin layer 2 around the exposed portions of the conductive particles and the undulations 2c (FIGS. 11 and 13) of the insulating resin layer right above the conductive particles, the ratio (Le/D) between the maximum depth Le of the inclination 2b and the average particle diameter D of the conductive particles 1A and 1B is preferably less than 50%, more preferably less than 30%, and further preferably 20% to 25%, the ratio (Ld/D) between the maximum diameter Ld of the inclination 2b or the undulation 2c and the average particle diameter D of the conductive particles 1A and 1B is preferably 100% or more, and more preferably 100% to 150%, and the ratio (Lf/D) between the maximum depth Lf of the undulation 2c and the average particle diameter D of the conductive particles 1A and 1B is more than zero, preferably less than 10%, and more preferably 5% or less.

The diameter Lc of the exposed (right above) part of the conductive particle 1A, 1B in the inclination 2b or the undulation 2c can be equal to or smaller than the average particle diameter D of the conductive particle 1A, 1B, and is preferably 10% to 90% of the average particle diameter D. The conductive particles 1A and 1B may be exposed at one point at the top of the conductive particles 1A and 1B, or the conductive particles 1A and 1B may be completely embedded in the insulating resin layer 2 so that the diameter Lc becomes zero.

Figure 14:
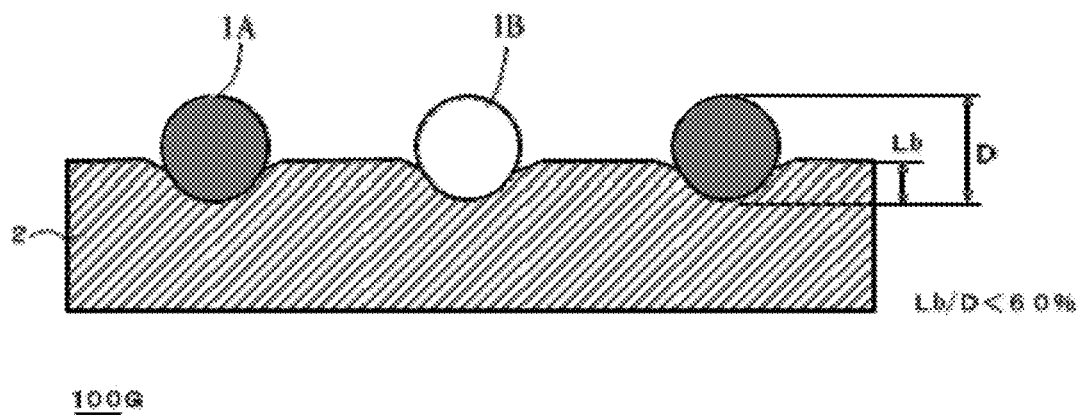
FIG. 14 is a cross-sectional view of the anisotropic conductive film 100G according to an example.

Note that, as shown in FIG. 14, since the conductive particles 1A and 1B easily roll on the insulating resin layer 2 in the anisotropic conductive film 100G having the embedded rate (Lb/D) of less than 60%, it is preferable to set the embedded rate (Lb/D) to 60% or more from the viewpoint of improving the capturing rate at the time of anisotropic conductive connection.

Figure 15:
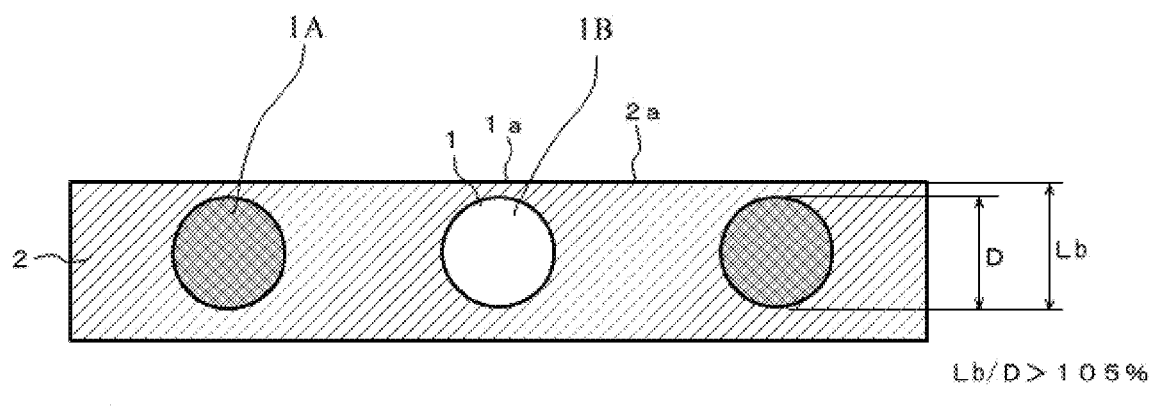
FIG. 15 is a cross-sectional view of an anisotropic conductive film 100X for comparative purpose.

In addition, in the aspect in which the embedded rate (Lb/D) exceeds 100%, when the surface of the insulating resin layer 2 is flat as in the anisotropic conductive films 100X of the comparative example shown in FIG. 15, the amount of the resin interposed between the conductive particles 1A, 1B and the terminals become excessively large. In addition, since the conductive particles 1A and 1B press the terminals via the insulating resin layer without being in direct contact with, and pressing, the terminal, the conductive particles are also easily flowed by the resin flow.

In the present invention, the presence of the inclination 2b and the undulation 2c on the surface of the insulating resin layer 2 can be confirmed by observing a cross section of an anisotropic conductive film with a scanning electron microscope, and can also be confirmed by surface field observation. The inclination 2b and the undulation 2c can also be observed by an optical microscope or a metallurgical microscope. Further, the size of the inclination 2b and the undulation 2c can be confirmed by adjusting the focus at the time of observing images. The same operation can be applied to the cases even after the inclination or undulation is reduced by the heat press as described above. This is because traces may remain.

(Composition of Insulating Resin Layer)

The insulating resin layer 2 can be formed of a curable resin composition, for example, a thermo-polymerizable composition containing a thermo-polymerizable compound and a thermal polymerization initiator. The thermo-polymerizable composition may contain a photopolymerization initiator as necessary.

When a thermal polymerization initiator and a photopolymerization initiator are used in combination, a thermo-polymerizable compound which also functions as a photo-polymerizable compound may be used as the thermo-polymerizable compound, or a photopolymerizable compound may be contained separately from the thermo-polymerizable compound. A photopolymerizable compound is preferably contained separately from the thermo-polymerizable compound. For example, a thermal cationic polymerization initiator is used as the thermal polymerization initiator, an epoxy compound is used as the thermo-polymerizable compound, a photoradical polymerization initiator is used as the photopolymerization initiator, and an acrylate compound is used as the photopolymerizable compound.

As the photopolymerization initiator, a plurality of types thereof which react with light having different wavelengths may be contained. As a result, it is possible to selectively use wavelengths used for light curing of the resin constituting the insulating resin layer at the time of producing the anisotropic conductive film and for light curing of the resin for bonding the electronic components to each other at the time of anisotropic conductive connection.

In the photocuring at the time of producing the anisotropic conductive film, all or part of the photopolymerizable compound contained in the insulating resin layer can be photocured. By this photocuring, the disposition of the conductive particles 1A and 1B in the insulating resin layer 2 is held or fixed, so that the suppression of short-circuiting and the improvement of the capturing properties are expected. In addition, the viscosity of the insulating resin layer in the production process of the anisotropic conductive film may be appropriately adjusted by this photocuring. In particular, the photocuring is preferably performed when the ratio (La/D) between the layer thickness La of the insulating resin layer 2 and the average particle diameter D of the conductive particles 1A and 1B is less than 0.6. This is because, even when the layer thickness of the insulating resin layer 2 is thin with respect to the particle diameter of the conductive particles, the disposition of the conductive particles is more reliably held or fixed by the insulating resin layer 2, and the viscosity of the insulating resin layer 2 is adjusted to suppress a decrease in yield in connection between electronic components using the anisotropic conductive film.

The mixed amount of the photopolymerizable compound in the insulating resin layer is preferably 30% by mass or less, more preferably 10% by mass or less, and further preferably less than 2% by mass. This is because too much an amount of the photopolymerizable compound increases the pushing-in thrust applied at the time of connection.

Examples of the thermo-polymerizable composition may include a thermal radical polymerizable acrylate-based composition containing a (meth)acrylate compound and a thermal radical polymerization initiator, and a thermal cationic polymerizable epoxy-based composition containing an epoxy compound and a thermal cationic polymerization initiator.

Instead of the thermal cationic polymerizable epoxy-based composition containing the thermal cationic polymerization initiator, a thermal anionic polymerizable epoxy-based composition containing a thermal anionic polymerization initiator may be used. Furthermore, a plurality of types of polymerizable compounds may be used in combination as long as they do not cause any particular problem. Examples of the combination may include a combination of a cationic polymerizable compound and a radical polymerizable compound.

As the (meth)acrylate compound, a conventionally known thermo-polymerizable (meth)acrylate monomer can be used. For example, monofunctional (meth)acrylate-based monomers, bifunctional or polyfunctional (meth)acrylate-based monomers may be used.

Examples of the thermal radical polymerization initiator may include an organic peroxide, and an azo compound. In particular, an organic peroxide which does not generate nitrogen which causes bubbles may preferably be used.

The amount of the thermal radical polymerization initiator used is preferably 2 parts by mass to 60 parts by mass, and more preferably 5 parts by mass to 40 parts by mass, with respect to 100 parts by mass of the (meth)acrylate compound, since too small an amount of the thermal radical polymerization initiator leads to poor curing and too large an amount of the thermal radical polymerization initiator leads to a decrease in product life.

Examples of the epoxy compound may include a bisphenol A type epoxy resin, a bisphenol F type epoxy resin, a novolac type epoxy resin, modified epoxy resins of these, and an alicyclic epoxy resin. Two or more types of these resins may be used in combination. In addition to the epoxy compound, an oxetane compound may be used in combination.

As the thermal cationic polymerization initiator, any known thermal cationic polymerization initiator for an epoxy compound may be adopted, and examples thereof used may include an iodonium salt, a sulfonium salt, a phosphonium salt, and a ferrocene, which generate an acid by heat. In particular, an aromatic sulfonium salt which exhibits good latency with respect to temperature may preferably be used.

The amount of the thermal cationic polymerization initiator used is preferably 2 parts by mass to 60 parts by mass, and more preferably 5 parts by mass to 40 parts by mass, with respect to 100 parts by mass of the epoxy compound, since too small an amount of the thermal cationic polymerization initiator tends to cause poor curing, and too large an amount thereof tends to lower the product life.

The thermo-polymerizable composition preferably contains a film forming resin or a silane coupling agent. Examples of the film forming resin may include a phenoxy resin, an epoxy resin, an unsaturated polyester resin, a saturated polyester resin, a urethane resin, a butadiene resin, a polyimide resin, a polyamide resin, and a polyolefin resin, and two or more of these resins may be used in combination. Of these, a phenoxy resin may preferably be used from the viewpoints of film forming property, processability, and connection reliability. The weight-average molecular weight is preferably 10000 or more. Examples of the silane coupling agent may include an epoxy-based silane coupling agent, and an acrylic silane coupling agent. These silane coupling agents are primarily alkoxysilane derivatives.

In order to adjust the melt viscosity, the thermo-polymerizable composition may contain insulating fillers in addition to the conductive particles 1A and 1B described above. Examples of the insulating fillers may include silica powder and alumina powder. Fine fillers having an insulating filler particle diameter of 20 to 1000 nm are preferable, and the mixed amount is preferably 5 parts by mass to 50 parts by mass with respect to 100 parts by mass of a thermo-polymerizable compound (photopolymerizable compound) such as an epoxy compound.

The anisotropic conductive film of the present invention may contain a filling agent, a softener, an accelerator, an antiaging agent, a colorant (pigment, dye), an organic solvent, an ion catcher agent, or the like, in addition to the above-mentioned insulating fillers.

(Layer Thickness of Insulating Resin Layer)

In the anisotropic conductive film according to the present invention, the ratio (La/D) between the layer thickness La of the insulating resin layer 2 and the average particle diameter D of the conductive particles 1A and 1B has a lower limit of 0.3 or more and an upper limit of 10 or less, because of reasons described later. Thus, the ratio is preferably 0.3 to 1, more preferably 0.6 to 8, and further more preferably 0.6 to 6. The average particle diameter D of the conductive particles 1A and 1B means an average particle diameter thereof. When the layer thickness La of the insulating resin layer 2 is too thick, the positions of the conductive particles 1A and 1B tend to deviate due to the resin flow at the time of the anisotropic conductive connection, so that the ability of the terminals to capture the conductive particles 1A and 1B is reduced. Since this tendency is outstanding at a ratio (La/D) of over 10, the ratio is preferably 8 or less, and more preferably 6 or less. On the contrary, when the layer thickness La of the insulating resin layer 2 is too thin and the ratio (La/D) is less than 0.3, it becomes difficult for the insulating resin layer 2 to maintain the conductive particles 1A and 1B in a predetermined particle dispersion state or predetermined disposition. Thus, the ratio (La/D) is preferably 0.3 or more, and more preferably 0.6 or more to reliably maintain the predetermined particle dispersion state or the predetermined disposition by the insulating resin layer 2. In a case where the terminal to be connected is high-density COG, the ratio (La/D) between the layer thickness La of the insulating resin layer 2 and the average particle diameter D of the conductive particles 1A and 1B is preferably 0.8 to 2.

On the other hand, when the average particle diameter D is 10 μm or more, the upper limit of the La/D is set to 3.5 or less, preferably 2.5 or less, and more preferably 2 or less, and the lower limit thereof is set to 0.8 or more, preferably 1 or more, and more preferably 1.3 or more.

In addition, if the layer thickness La of the insulating resin layer 2 is too large and the ratio (La/D) becomes excessively large regardless of the size of the average particle diameter D, it becomes difficult for the conductive particles 1A and 1B to be pressed against the terminals at the time of anisotropic conductive connection, and the conductive particles are easily flowed by the resin flow. Therefore, the conductive particles are easily displaced, and the conductive particle capturing properties at the terminals are lowered. In addition, the thrust required for the pressing jig to press the conductive particles against the terminals also increases, which hinders the low-pressure mounting. On the contrary, when the layer thickness La of the insulating resin layer 2 is too small and the ratio becomes excessively small, it becomes difficult for the insulating resin layer 2 to maintain the conductive particles 1A and 1B in a predetermined position.

Modified Embodiment

Figure 6:
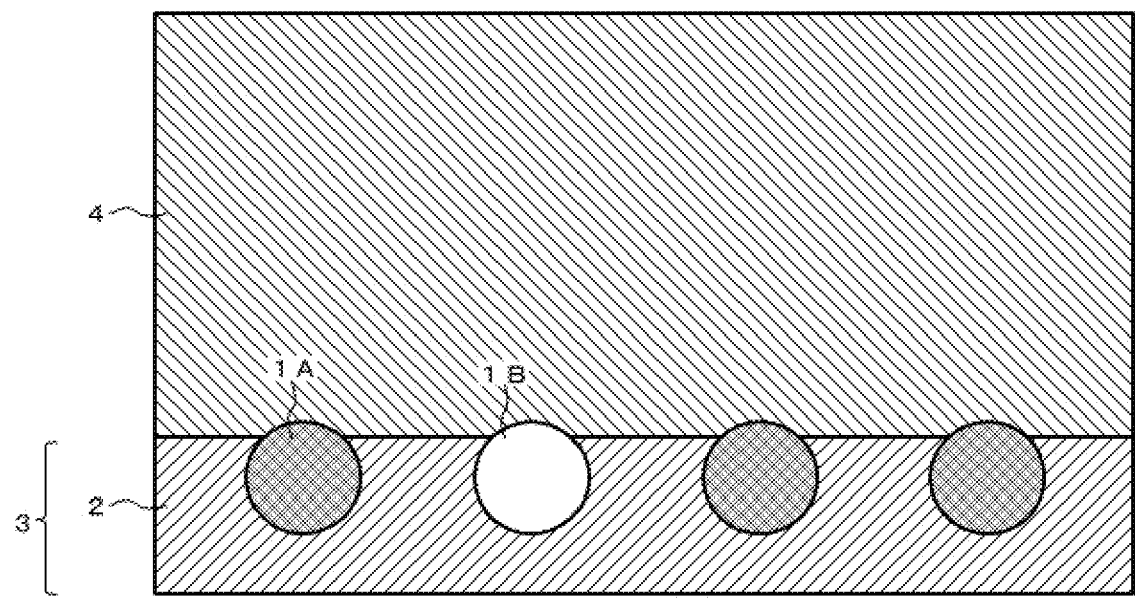
FIG. 6 is a cross-sectional view of the anisotropic conductive film 10F according to an example.
Figure 7:
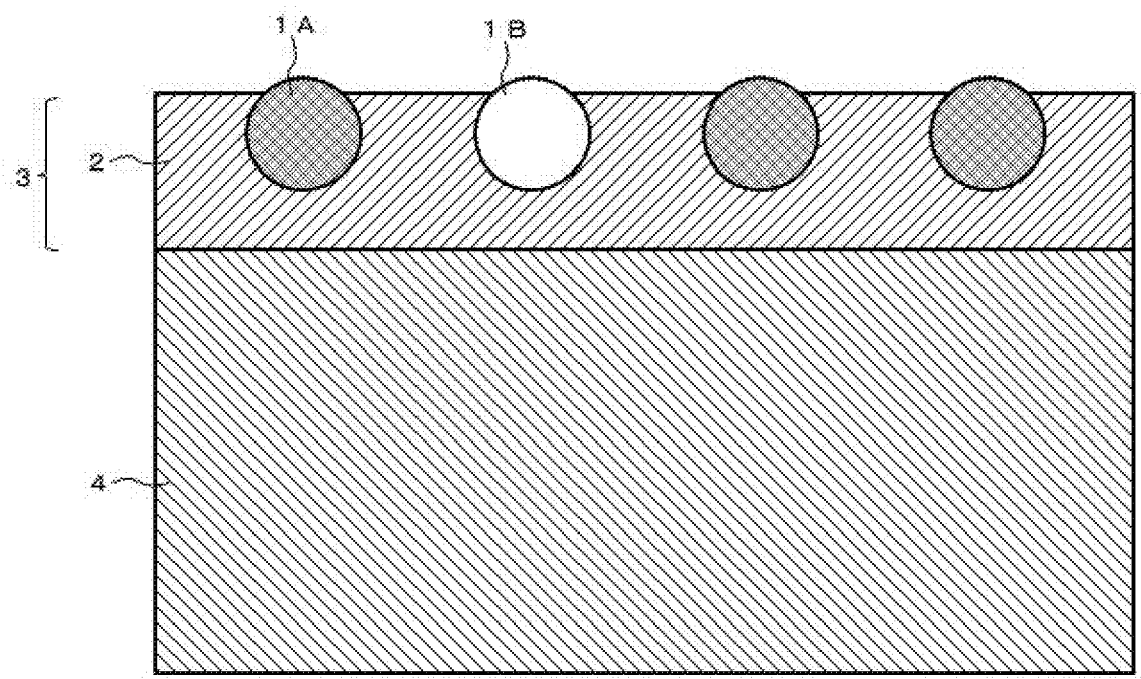
FIG. 7 is a cross-sectional view of the anisotropic conductive film 10G according to an example.

As the anisotropic conductive film according to the present invention, a second insulating resin layer 4 having a lower minimum melt viscosity than the resin that constitutes insulating resin layer 2 may be laminated on the conductive particle dispersed layer 3 (FIGS. 6 and 7). The second insulating resin layer 4 can fill space formed by the terminals, such as bumps, of the electronic component at the time of the anisotropic conductive connection, and improve the adhesion properties for the opposite electronic components therebetween. In other words, in order to allow the electronic component to be mounted at lower pressure using the anisotropic conductive film, and to improve the particle capturing properties for the conductive particles 1A and 1B by suppressing the resin flow of the insulating resin layer 2 at the time of the anisotropic conductive connection, it is desirable to increase the viscosity of the insulating resin layer 2 and reduce the thickness of the insulating resin layer 2 as long as the positions of the conductive particles 1A and 1B do not deviate. However, the excessively thin insulating resin layer 2 causes lack of the amount of resin to bond the opposite electronic components to each other, so that there is a concern about a reduction in adhesion properties. Against this, the provision of the second insulating resin layer 4 having a lower viscosity than that of the insulating resin layer 2 at the time of the anisotropic conductive connection allows improvement in the adhesion properties between the electronic components, and makes it difficult to inhibit holding and pushing the conductive particles 1A and 1B by the terminals, because the fluidity of the second insulating resin layer 4 is higher than that of the insulating resin layer 2.

When the second insulating resin layer 4 is laminated on the conductive particle dispersed layer 3, the second insulating resin layer 4 is preferably bonded to the electronic component to which a pressure is applied by a tool, irrespective of whether the second insulating resin layer 4 is on the surface having the concaves 2b (the insulating resin layer 2 is bonded to the electronic component to be put on a stage). This prevents unnecessary movement of the conductive particles, and allows improvement in capturing properties.

The larger the difference, i.e. the ratio in minimum melt viscosity between the insulating resin layer 2 and the second insulating resin layer 4, the more easily the space formed by electrodes and bumps of the electronic component is filled with the second insulating resin layer 4, and the more improved the adhesion properties for the electronic components. The larger the difference, the less the relative movement amount of the insulating resin layer 2 present in the conductive particle dispersed layer 3, and the less the conductive particles 1A and 1B between the terminals flow by a resin flow, so that the capturing properties of the terminals to capture the conductive particles 1A and 1B are preferably improved. In practical use, the minimum melt viscosity ratio of the insulating resin layer 2 to the second insulating resin layer 4 is preferably 2 or more, more preferably 5 or more, and further more preferably 8 or more. On the other hand, if the ratio is too high, in a case where the anisotropic conductive film is formed into a long-length wound roll, a resin is apt to protrude or block, so that the ratio is preferably 15 or less in practical use. To be more specific, the minimum melt viscosity of the second insulating resin layer 4 is preferably 3000 Pa·s or less, more preferably 2000 Pa·s or less, and further more preferably 100 Pa·s to 2000 Pa·s, while satisfying the above ratio.

Note that, the second insulating resin layer 4 can be formed of the same resin composition as the insulating resin layer 2 by adjusting its viscosity.

The layer thickness of the second insulating resin layer 4 is preferably 4 μm to 20 μm. Otherwise, the layer thickness of the second insulating resin layer 4 is preferably 1 to 8 times the average particle diameter D of the conductive particles 1A and 1B.

The minimum melt viscosity of whole anisotropic conductive films 10F and 10G, each of which includes the insulating resin layer 2 and the second insulating resin layer 4, is 8000 Pa·s or less in practical use, preferably 200 Pa·s to 7000 Pa·s, and more preferably 200 Pa·s to 4000 Pa·s.

As a concrete embodiment of lamination of the second insulating resin layer 4, for example, as in the case of the anisotropic conductive film 10F illustrated in FIG. 6, when the conductive particles 1A and 1B protrude from one surface of the insulating resin layer 2, the second insulating resin layer 4 is laminated on the surface having the protrusions, so that the conductive particles 1A and 1B dig into the second insulating resin layer 4. When the embedded rate (Lb/D) of the conductive particles 1A and 1B is 0.95 or less, the second insulating resin layer 4 is preferably laminated in this manner. When the embedded rate (Lb/D) is 0.9 or less, the second insulating resin layer 4 is more preferably laminated in this manner. When the average particle diameter D is less than 10 μm, this lamination is desirable in some cases.

On the other hand, as in the case of the anisotropic conductive film 10G illustrated in FIG. 7, the second insulating resin layer 4 may be laminated on a surface opposite to the surface of the insulating resin layer 2 in which the conductive particles 1A and 1B are embedded.

(Third Insulating Resin Layer)

A third insulating resin layer may be provided on the opposite side to the second insulating resin layer 4 with the insulating resin layer 2 interposed therebetween. The third insulating resin layer can function as a tack layer. As in the case of the second insulating resin layer 4, the third insulating resin layer may be provided to fill space formed by electrodes and bumps of the electronic component.

The resin composition, viscosity and thickness of the third insulating resin layer may be the same as or different from those of the second insulating resin layer 4. There is no specific limitation on the minimum melt viscosity of the anisotropic conductive film, including the insulating resin layer 2, the second insulating resin layer 4 and the third insulating resin layer, but the minimum melt viscosity is 8000 Pa·s or less in practical use, preferably 200 Pa·s to 7000 Pa·s, and more preferably 200 Pa·s to 4000 Pa·s.

<Method for Producing Anisotropic Conductive Film>

The anisotropic conductive film according to the present invention can be produced by, for example, holding the conductive particles 1A and 1B on a surface of the insulating resin layer 2 in individually independent established regular disposition or a random dispersion state, and pushing the conductive particles 1A and 1B into the insulating resin layer 2 by a flat plate or a roller.

The embedded amount Lb of the conductive particles 1A and 1B in the insulating resin layer 2 can be adjusted by pressing force, temperature, and the like at the time of pushing the conductive particles 1A and 1B. The presence or absence, shape, and depth of the concaves 2b and 2c can be adjusted by the viscosity of the insulating resin layer 2, pushing speed, temperature and the like at the time of pushing.

A method for holding the conductive particles 1A and 1B in the insulating resin layer 2 is not specifically limited, but when the conductive particles 1A and 1B are regularly disposed, the conductive particles 1A and 1B mixed at a predetermined ratio are held on the insulating resin layer 2 using, for example, a transfer mold. As the transfer mold, for example, a mold in which openings are formed by a well-known opening formation method such as photolithography in a transfer mold material such as an inorganic material including silicon, various types of ceramics, glass, metals such as stainless steel and the like, or an organic material including various types of resins can be used. The transfer mold can be in the shape of a plate, a roll or the like.

As a method for obtaining disposition in which the conductive particles 1A and 1B of the insulating resin layer 2 are in a random dispersion state and not individually independent in a random dispersion state, the conductive particles 1A and 1B may be mixed and kneaded (mixed) into a resin composition of the insulating resin layer 2 at a predetermined ratio, and the mixture may be applied to a release film, to obtain the insulating resin layer in which the conductive particles 1A and 1B are positioned at random.

To economically connect the electronic component using the anisotropic conductive film, the anisotropic conductive film is preferably long in some degree. The anisotropic conductive film is produced so as to have a length of preferably 5 m or more, more preferably 10 m or more, and further more preferably 25 m or more. On the hand, when the anisotropic conductive film is made too long, an existing connection device, which is used for producing the electronic component using the anisotropic conductive film, cannot be used and handleability deteriorates. Thus, the anisotropic conductive film is produced so as to have a length of preferably 5000 m or less, more preferably 1000 m or less, and further more preferably 500 m or less. The long anisotropic conductive film is preferably made into a wound roll around a winding core, in view of superior handleability.

<Method for Using Anisotropic Conductive Film>

The anisotropic conductive film according to the present invention is preferably used for connecting a first electronic component such as an IC chip, an IC module or an FPC, and a second electronic component such as an FPC, a glass substrate, a plastic substrate, a rigid substrate or a ceramic substrate, by anisotropic conductive connection. In particular, as the plastic substrate, mentioned can a substrate be in which terminals are formed in a PET substrate on which a deformation or a crack is apt to occur by high pressure bonding. Note that, the PET substrate may be formed of polyimide substrates laminated with an adhesive agent. The total thickness thereof may be, for example, 0.15 mm or less. With the use of the anisotropic conductive film according to the present invention, IC chips or wafers may be stacked in layers. Note that, the electronic component connected with the anisotropic conductive film according to the present invention is not limited to the above-described electronic components. The anisotropic conductive film according to the present invention can be used for various types of electronic components, which are diversified in recent years. The present invention also encompasses a connection structure in which the electronic components are connected to each other using the anisotropic conductive film according to the present invention. The present invention also encompasses a method for producing a connection structure having a step for anisotropically conductively connecting the first electronic component and the second electronic component with disposing the anisotropic conductive film according to the present invention therebetween.

As a method for connecting the electronic components using the anisotropic conductive film, when the resin layer of the anisotropic conductive film is formed of a single layer of the conductive particle dispersed layer 3, the anisotropic conductive film is temporarily bonded and temporarily pressure bonded to the second electronic component such as various types of substrates, from the side of a surface of the anisotropic conductive film in which the conductive particles 1A and 1B are embedded, and the first electronic component such as an IC chip, is aligned with and thermocompression bonded to the temporarily pressure bonded anisotropic conductive film on the side of a surface in which the conductive particles 1A and 1B are not embedded, to manufacture it. When the insulating resin layer of the anisotropic conductive film contains a photopolymerization initiator and a photopolymerizable compound (may be the same as a thermal-polymerizable compound), in addition to a thermal polymerization initiator and the thermal-polymerizable compound, a pressure bonding method using both light and heat may be adopted. This can minimize unintended movement of the conductive particles. The anisotropic conductive film may be used by temporarily bonding the anisotropic conductive film to the second electronic component on the side where the conductive particles are not embedded. Note that the anisotropic conductive film may be temporarily bonded to the first electronic component instead of to the second electronic component.

When the anisotropic conductive film is formed of a laminate of the conductive particle dispersed layer 3 and the second insulating resin layer 4, the conductive particle dispersed layer 3 is temporarily bonded and temporarily pressure bonded to the second electronic component, such as various types of substrates, and the first electronic component such as an IC chip is aligned with, mounted on, and thermocompression bonded to the temporarily pressure bonded anisotropic conductive film on the side of the second insulating resin layer 4. The anisotropic conductive film may be temporarily bonded to the first electronic component on the side of the second insulating resin layer 4. The anisotropic conductive film may be used by temporarily bonded to the first electronic component on the side of the conductive particle dispersed layer 3.

EXAMPLES

The present invention will be described below in the concrete on the basis of examples.

Examples 1 to 4 and Comparative Examples 1 and 2

(1) Production of Anisotropic Conductive Film

A resin composition for forming an insulating resin layer to form a conductive particle dispersed layer, and a resin composition for forming a second insulating resin layer, were each prepared at formulations shown in Table 1. The minimum melt viscosity of the insulating resin layer was 3000 Pa·s or more, and the ratio of the minimum melt viscosity of the insulating resin layer to the minimum melt viscosity of the second insulating resin layer was 2 or more.

On the other hand, high hardness conductive particles (a 20% compression elastic modulus of 22000 $N/mm^2$, an average particle diameter of 3 μm, manufactured by Sekisui Chemical Co., Ltd.) each having approximately 70 alumina particles (average particle diameter of 150 nm) on a surface of a resin core particle and having a Ni layer (a thickness of 100 nm) as an outermost layer (those produced by a method described in Japanese Patent Application Laid-Open No. 2006-269296) were prepared, and low hardness conductive particles (a 20% compression elastic modulus of 6000 $N/mm^2$, an average particle diameter of 3 μm, manufactured by Sekisui Chemical Co., Ltd.) having the same structure as the high hardness conductive particles were prepared. Note that, in the following Examples 1 to 24 and Comparative Example 1 to 10, conductive particles manufactured in the same manner by Sekisui Chemical Co., Ltd. were prepared.

The high hardness conductive particles and the low hardness conductive particles were mixed into the resin composition for forming the insulating resin layer (high viscosity resin layer) such that their number density had ratios shown in Table 2, and the composition was applied to a PET film having a film thickness of 50 µm with a bar coater and dried in an oven of 80° C. for 5 minutes, to form a conductive particle dispersed layer in which the high hardness conductive particles and the low hardness conductive particles were dispersed at random on the PET film. In the conductive particle dispersed layer, the thickness of the insulating resin layer was 6 The resin composition for forming the second insulating resin layer was applied with a bar coater to a PET film having a film thickness of 50 and dried in the oven of 80° C. for 5 minutes, to form a resin layer that was to be the second insulating resin layer having a thickness of 12 µm on the PET film. The resin layer was laminated on the aforementioned conductive particle dispersed layer to make an anisotropic conductive film.

evaluated on the basis of the following criterion. An evaluation of B or better is preferable in practical use.

Capture Efficiency Criterion
A: 30% or more
B: 15% or more and less than 30%
C: less than 15%
(b) Impressions Impressions of the high hardness conductive particles and the low hardness conductive particles in the connection structure for evaluation produced in (a) were observed by a metallographic microscope. As to 5 pairs of terminals after heated and pressurized, the numbers of the impressions (captures) of the high hardness conductive particles and the low hardness conductive particles were measured using an image analysis software WinROOF (Mitani Corporation), and the average thereof was calculated. A theoretical value of the high hardness conductive particles and the low hardness conductive particles present on the terminal before heated and pressurized was calculated from [terminal area of 5 terminals]×[number density of conductive particles], and the ratio of the calculated impression (capture) number of the conductive particles to the theoretical value was evalu-

TABLE 1

| | Formulation | Parts by mass |
|---|---|---|
| Insulating Resin Layer (High Viscosity Resin Layer) | Phenoxy Resin (Nippon Steel & Sumikin Chemical Co., Ltd., YP-50) | 40 |
| | Silica Filler (Nippon Aerosil Co., Ltd., Aerosil R805) | 25 |
| | Liquid Epoxy Resin (Mitsubishi Chemical Co., Ltd., jER828) | 30 |
| | Silane Coupling Agent (Shin-Etsu Chemical Co., Ltd., KBM-403) | 2 |
| | Thermal Cationic Polymerization Initiator (Sanshin Chemical Industry Co., Ltd., SI-60L) | 3 |
| Second Insulating Resin Layer | Phenoxy Resin (Nippon Steel & Sumikin Chemical Co., Ltd., YP-50) | 40 |
| | Silica Filler (Nippon Aerosil Co., Ltd., Aerosil R805) | 5 |
| | Liquid Epoxy Resin (Mitsubishi Chemical Co., Ltd., jER828) | 50 |
| | Silane Coupling Agent (Shin-Etsu Chemical Co., Ltd., KBM-403) | 2 |
| | Thermal Cationic Polymerization Initiator (Sanshin Chemical Industry Co., Ltd., SI-60L) | 3 |

(2) Evaluation of Anisotropic Conductive Film

A connection structure of an electronic component was produced using the anisotropic conductive film of each of the examples and the comparative examples, which was produced in (1) and cut into a sufficient area for connection, and (a) capture efficiency, (b) impressions, (c) particle crush ratio and (d) resistance value were evaluated as follows. Results are shown in Table 2.

(a) Capture Efficiency

A connection structure for evaluation was obtained by applying a pressure to an IC for evaluation shown below and a glass substrate having a terminal pattern corresponding to that of the IC for evaluation (Ti/Al wiring) through the anisotropic conductive film at 200° C. with a pressure force described in Table 2 for 5 seconds.

IC for evaluation:
Outside shape 1.8×20.0 mm
Thickness 0.5 mm
Bump specifications: size 30×85 µm, inter-bump distance 20 µm, material of surface of bump Au As to 100 pairs of terminals after being heated and pressurized, the numbers of the captured high hardness conductive particles and low hardness conductive particles were measured, and their average was calculated. A theoretical value of the high hardness conductive particles and the low hardness conductive particles present on the terminals before the thermal pressurization was calculated from [terminal area of 100 terminals]×[number density of conductive particles], and the ratio of the calculated number of the captured conductive particles to the theoretical value was ated on the basis of the following criterion. Note that the total number of recognized impressions of 5 bumps was on the order of 100 in the dispersed type anisotropic conductive film in which the conductive particles were disposed at random, while the total number of recognized impressions of 5 bumps was on the order of 200 in the arranged type anisotropic conductive film described later, in which the conductive particles were arranged in a square lattice.

Impression Evaluation Criterion
OK: an instance in which 50% or more of the theoretical value can be recognized as impressions
NG: an instance in which less than 50% of the theoretical value can be recognized as impressions (c) Particle Crush Ratio In each of the connection structure for evaluation produced in (a) immediately after the production (initial state) and the connection structure for evaluation produced in (a) and put in a thermostatic bath with a temperature of 85° C. and a humidity of 85% RH for 500 hours (500 h), the distances between opposite terminals were measured as a particle diameter after the pressure bonding, and the average particle diameter thereof was calculated. On the other hand, an average particle diameter before the pressure bonding was also calculated, and a particle crush ratio was calculated by the following formula and evaluated on the basis of the following criterion. An evaluation of B or better is preferable in practical use.

Particle crush ratio (%)=([average particle diameter before pressure bonding]−[average particle diameter after pressure bonding])×100/[average particle diameter before pressure bonding]

Particle Crush Ratio Evaluation Criterion at initial and 500 h
A: 10% or more
B: 5% or more and less than 10%
C: less than 5%
(d) Resistance Value
In each of the connection structure for evaluation produced in (a) immediately after the production (initial state) and the connection structure for evaluation produced in (a) and put in the thermostatic bath with a temperature of 85° C. and a humidity of 85% RH for 500 hours (500 h), a conduction resistance was measured by a four-terminal method and evaluated on the basis of the following criterion. The resistance values preferably have evaluations of B or better, in practical use.
Resistance Value Evaluation Criterion in Initial State
A: less than 3Ω
B: 3Ω or more and less than 5Ω
C: 5Ω or more and less than 10Ω
D: 10Ω or more
Resistance value evaluation criterion at 500 h
A: less than 3Ω
B: 3Ω or more and less than 5Ω
C: 5Ω or more and less than 10Ω
D: 10Ω or more Examples 5 to 8 and Comparative Examples 3 and 4

The same conductive particles as Example 1 were prepared. However, conductive particles (having an average particle diameter of 3 μm) having a 20% compression elastic modulus of 14000 N/mm$^2$ were prepared as high hardness conductive particles, and conductive particles (having an average particle diameter of 3 μm) having a 20% compression elastic modulus of 6000 N/mm$^2$ were prepared as low hardness conductive particles, by adjusting the 20% compression elastic moduli of resin core particles.
An anisotropic conductive film in which the high hardness conductive particles and the low hardness conductive particles were dispersed at random was produced in the same manner as Example 1, except that the high hardness conductive particles and the low hardness conductive particles were mixed in a resin composition for forming an insulating resin layer (high viscosity resin layer) at ratios shown in Table 3.
In the same manner as Example 1, (a) capture efficiency, (b) impressions, (c) particle crush ratio and (d) resistance value were evaluated. Results are shown in Table 3.

Examples 9 to 12 and Comparative Example 5

The same conductive particles as Example 1 were prepared. However, conductive particles (having an average particle diameter of 3 μm) having a 20% compression elastic modulus of 9000 N/mm$^2$ were prepared as high hardness conductive particles, and conductive particles (having an average particle diameter of 3 μm) having a 20% compression elastic modulus of 6000 N/mm$^2$ were prepared as low hardness conductive particles, by adjusting the 20% compression elastic moduli of resin core particles.
An anisotropic conductive film in which the high hardness conductive particles and the low hardness conductive particles were dispersed at random was produced in the same manner as Example 1, except that the high hardness conductive particles and the low hardness conductive particles were mixed in a resin composition for forming an insulating resin layer (high viscosity resin layer) at ratios shown in Table 4.
In the same manner as Example 1, (a) capture efficiency, (b) impressions, (c) particle crush ratio and (d) resistance value were evaluated. Results are shown in Table 4.

Examples 13 to 16 and Comparative Examples 6 and 7

A resin composition for forming an insulating resin layer, to form a conductive particle dispersed layer, was prepared at the formulation in Table 1, and applied to a PET film having a film thickness of 50 μm with a bar coater and dried in an oven of 80° C. for 5 minutes, to form the insulating resin layer on the PET film. The thickness of the insulating resin layer was 6 μm. A resin composition for forming a second insulating resin layer was prepared at the formulation shown in Table 1, and the resin layer having a thickness of 12 μm was formed in the same manner.
In the same manner as Example 1, high hardness conductive particles having a 20% compression elastic modulus of 22000 N/mm$^2$ and low hardness conductive particles having a 20% compression elastic modulus of 6000 N/mm$^2$ were prepared.
On the other hand, a metal mold was produced such that the conductive particles were arranged in a square lattice, as illustrated in FIG. 1A, and the whole number density of the high hardness conductive particles and low hardness conductive particles became a value shown in Table 5. Known transparent resin pellets in a melt state were poured into the metal mold, and cooled and cured to form a resin mold in which concaves were in an arrangement pattern illustrated in FIG. 1A.
The high hardness conductive particles and the low hardness conductive particles were mixed in a ratio shown in Table 5 and charged into the concaves of the resin mold. The above-described insulating resin layer was overlaid and bonded thereon by being pressed at 60° C. with 0.5 MPa. Then, the insulating resin layer was peeled off from the mold, and the conductive particles on the insulating resin layer were pushed into the insulating resin layer (on pushing conditions: 60 to 70° C. and 0.5 MPa) to form a conductive particle dispersed layer. In this case, the embedded rate thereof was 99.9%. On the surface of the conductive particle dispersed layer into which the conductive particles were embedded, a resin layer formed of the above-described resin composition for forming the second insulating resin layer was laminated, to produce an anisotropic conductive film in which the high hardness conductive particles and the low hardness conductive particles were arranged in a square lattice as a whole.
The anisotropic conductive film obtained in this manner was cut into a sufficient area. A connection structure for evaluation was produced using the cut anisotropic conductive film in the same manner as Example 1, and (a) capture efficiency, (b) impressions, (c) particle crush ratio, and (d) resistance value were evaluated. Results are shown in Table 5.

Examples 17 to 20 and Comparative Examples 8 and 9

In the same manner as in Example 5, high hardness conductive particles having a 20% compression elastic modulus of 14000 N/mm² and low hardness conductive particles having a 20% compression elastic modulus of 6000 N/mm² were prepared.

An anisotropic conductive film in which the high hardness conductive particles and the low hardness conductive particles were arranged in a square lattice as a whole was produced in the same manner as that in Example 13 except that the high hardness conductive particles and the low hardness conductive particles were mixed in ratios shown in Table 6 and charged into the concaves of the resin mold.

The anisotropic conductive film was cut into a sufficient area for connection in the same manner as Example 1, and used for evaluations of (a) capture efficiency, (b) impressions, (c) particle crush ratio, and (d) resistance value. Results are shown in Table 6.

Examples 21 to 24 and Comparative Example 10

In the same manner as in Example 9, high hardness conductive particles having a 20% compression elastic modulus of 9000 N/mm² and low hardness conductive particles having a 20% compression elastic modulus of 6000 N/mm² were prepared.

An anisotropic conductive film in which the high hardness conductive particles and the low hardness conductive particles were arranged in a square lattice as a whole was produced in the same manner as that in Example 13 except that the high hardness conductive particles and the low hardness conductive particles were mixed in ratios shown in Table 7 and charged into the concaves of the resin mold.

The anisotropic conductive film was cut into a sufficient area for connection in the same manner as Example 1, and used for evaluation of (a) capture efficiency, (b) impressions, (c) particle crush ratio, and (d) resistance value. Results are shown in Table 7.

TABLE 2

| | Comparative Example 1 | Example 1 |
|---|---|---|
| Disposition Of All Conductive Particles | Random | Random |
| High Hardness Conductive Particle K Value (N/mm²) | 22000 | 22000 |
| Low Hardness Conductive Particle K Value (N/mm²) | 6000 | 6000 |
| Number Density Ratio (High:low) | 100:0 | 90:10 |
| Total Number Density (Particles/mm²) | 56000 | 56000 |

| | | | Particle Crush Ratio | | Resistance Value | | | | Particle Crush Ratio | | Resistance Value | |
|---|---|---|---|---|---|---|---|---|---|---|---|---|
| Evaluation | Capture Efficiency | Impression | Initial State | 500 h | Initial State | 500 h | Capture Efficiency | Impression | Initial State | 500 h | Initial State | 500 h |
| Pressure 90 MPa | B | NG | B | C | B | C | B | OK | A | B | A | B |
| Pressure 120 MPa | B | OK | B | B | A | A | B | OK | A | A | A | A |

| | Example 2 |
|---|---|
| Disposition Of All Conductive Particles | Random |
| High Hardness Conductive Particle K Value (N/mm²) | 22000 |
| Low Hardness Conductive Particle K Value (N/mm²) | 6000 |
| Number Density Ratio (High:low) | 70:30 |
| Total Number Density (Particles/mm²) | 56000 |

| | | | Particle Crush Ratio | | Resistance Value | |
|---|---|---|---|---|---|---|
| Evaluation | Capture Efficiency | Impression | Initial State | 500 h | Initial State | 500 h |
| Pressure 90 MPa | B | OK | A | A | A | B |
| Pressure 120 MPa | B | OK | A | A | A | A |

| | Example 3 | Example 4 |
|---|---|---|
| Disposition Of All Conductive Particles | Random | Random |
| High Hardness Conductive Particle K Value (N/mm²) | 22000 | 22000 |
| Low Hardness Conductive Particle K Value (N/mm²) | 6000 | 6000 |
| Number Density Ratio (High:low) | 50:50 | 30:70 |
| Total Number Density (Particles/mm²) | 56000 | 56000 |

TABLE 2-continued

| Evaluation | Capture Efficiency | Impression | Particle Crush Ratio Initial State | Particle Crush Ratio 500 h | Resistance Value Initial State | Resistance Value 500 h | Capture Efficiency | Impression | Particle Crush Ratio Initial State | Particle Crush Ratio 500 h | Resistance Value Initial State | Resistance Value 500 h |
|---|---|---|---|---|---|---|---|---|---|---|---|---|
| Pressure 90 MPa | B | OK | B | B | A | B | B | OK | A | A | A | A |
| Pressure 120 MPa | B | OK | A | A | A | A | B | OK | A | A | A | A |

| Comparative Example 2 | |
|---|---|
| Disposition Of All Conductive Particles | Random |
| High Hardness Conductive Particle K Value (N/mm$^2$) | 22000 |
| Low Hardness Conductive Particle K Value (N/mm$^2$) | 6000 |
| Number Density Ratio (High:low) | 0:100 |
| Total Number Density (Particles/mm$^2$) | 56000 |

| Evaluation | Capture Efficiency | Impression | Particle Crush Ratio Initial State | Particle Crush Ratio 500 h | Resistance Value Initial State | Resistance Value 500 h |
|---|---|---|---|---|---|---|
| Pressure 90 MPa | B | NG | A | A | A | A |
| Pressure 120 MPa | B | NG | A | A | A | A |

TABLE 3

| | Comparative Example 3 | Example 5 |
|---|---|---|
| Disposition Of All Conductive Particles | Random | Random |
| High Hardness Conductive Particle K Value (N/mm$^2$) | 14000 | 14000 |
| Low Hardness Conductive Particle K Value (N/mm$^2$) | 6000 | 6000 |
| Number Density Ratio (High:low) | 100:0 | 90:10 |
| Total Number Density (Particles/mm$^2$) | 56000 | 56000 |

| Evaluation | Capture Efficiency | Impression | Particle Crush Ratio Initial State | Particle Crush Ratio 500 h | Resistance Value Initial State | Resistance Value 500 h | Capture Efficiency | Impression | Particle Crush Ratio Initial State | Particle Crush Ratio 500 h | Resistance Value Initial State | Resistance Value 500 h |
|---|---|---|---|---|---|---|---|---|---|---|---|---|
| Pressure 60 MPa | B | NG | B | C | B | C | B | OK | B | B | B | B |
| Pressure 90 MPa | B | NG | A | A | A | A | B | OK | A | A | A | A |
| Pressure 120 MPa | B | OK | A | A | A | A | B | OK | A | A | A | A |

| Example 6 | |
|---|---|
| Disposition Of All Conductive Particles | Random |
| High Hardness Conductive Particle K Value (N/mm$^2$) | 14000 |
| Low Hardness Conductive Particle K Value (N/mm$^2$) | 6000 |
| Number Density Ratio (High:low) | 70:30 |
| Total Number Density (Particles/mm$^2$) | 56000 |

| Evaluation | Capture Efficiency | Impression | Particle Crush Ratio Initial State | Particle Crush Ratio 500 h | Resistance Value Initial State | Resistance Value 500 h |
|---|---|---|---|---|---|---|
| Pressure 60 MPa | B | OK | A | A | A | B |
| Pressure 90 MPa | B | OK | A | A | A | A |
| Pressure 120 MPa | B | OK | A | A | A | A |

| | Example 7 | Example 8 |
|---|---|---|
| Disposition Of All Conductive Particles | Random | Random |
| High Hardness Conductive Particle K Value (N/mm$^2$) | 14000 | 14000 |

TABLE 3-continued

| | | | | | | | | | | | | | |
|---|---|---|---|---|---|---|---|---|---|---|---|---|---|
| Low Hardness Conductive Particle K Value (N/mm²) | | | 6000 | | | | | | 6000 | | | | |
| Number Density Ratio (High:low) | | | 50:50 | | | | | | 30:70 | | | | |
| Total Number Density (Particles/mm²) | | | 56000 | | | | | | 56000 | | | | |

| Evaluation | Capture Efficiency | Impression | Particle Crush Ratio | | Resistance Value | | Capture Efficiency | Impression | Particle Crush Ratio | | Resistance Value | |
|---|---|---|---|---|---|---|---|---|---|---|---|---|
| | | | Initial State | 500 h | Initial State | 500 h | | | Initial State | 500 h | Initial State | 500 h |
| Pressure 60 MPa | B | OK | A | A | A | B | B | OK | A | A | A | B |
| Pressure 90 MPa | B | OK | A | A | A | A | B | OK | A | A | A | A |
| Pressure 120 MPa | B | OK | A | A | A | A | B | OK | A | A | A | A |

Comparative Example 4

| | |
|---|---|
| Disposition Of All Conductive Particles | Random |
| High Hardness Conductive Particle K Value (N/mm²) | 14000 |
| Low Hardness Conductive Particle K Value (N/mm²) | 6000 |
| Number Density Ratio (High:low) | 0:100 |
| Total Number Density (Particles/mm²) | 56000 |

| Evaluation | Capture Efficiency | Impression | Particle Crush Ratio | | Resistance Value | |
|---|---|---|---|---|---|---|
| | | | Initial State | 500 h | Initial State | 500 h |
| Pressure 60 MPa | B | NG | A | A | A | B |
| Pressure 90 MPa | B | NG | A | A | A | A |
| Pressure 120 MPa | B | NG | A | A | A | A |

TABLE 4

| | Example 9 | Example 10 |
|---|---|---|
| Disposition Of All Conductive Particles | Random | Random |
| High Hardness Conductive Particle K Value (N/mm²) | 9000 | 9000 |
| Low Hardness Conductive Particle K Value (N/mm²) | 6000 | 6000 |
| Number Density Ratio (High:low) | 90:10 | 70:30 |
| Total Number Density (Particles/mm²) | 28000 | 28000 |

| Evaluation | Capture Efficiency | Impression | Particle Crush Ratio | | Resistance Value | | Capture Efficiency | Impression | Particle Crush Ratio | | Resistance Value | |
|---|---|---|---|---|---|---|---|---|---|---|---|---|
| | | | Initial State | 500 h | Initial State | 500 h | | | Initial State | 500 h | Initial State | 500 h |
| Pressure 60 MPa | B | OK | A | A | A | A | B | OK | A | A | A | A |
| Pressure 90 MPa | B | OK | A | A | A | A | B | OK | A | A | A | A |

Example 11

| | |
|---|---|
| Disposition Of All Conductive Particles | Random |
| High Hardness Conductive Particle K Value (N/mm²) | 9000 |
| Low Hardness Conductive Particle K Value (N/mm²) | 6000 |
| Number Density Ratio (High:low) | 50:50 |
| Total Number Density (Particles/mm²) | 28000 |

| Evaluation | Capture Efficiency | Impression | Particle Crush Ratio | | Resistance Value | |
|---|---|---|---|---|---|---|
| | | | Initial State | 500 h | Initial State | 500 h |
| Pressure 60 MPa | B | OK | A | A | A | A |
| Pressure 90 MPa | B | OK | A | A | A | A |

TABLE 4-continued

|  | Example 12 | Comparative Example 5 |
|---|---|---|
| Disposition Of All Conductive Particles | Random | Random |
| High Hardness Conductive Particle K Value (N/mm$^2$) | 9000 | 9000 |
| Low Hardness Conductive Particle K Value (N/mm$^2$) | 6000 | 6000 |
| Number Density Ratio (High:low) | 30:70 | 0:100 |
| Total Number Density (Particles/mm$^2$) | 28000 | 28000 |

| Evaluation | Capture Efficiency | Impression | Particle Crush Ratio Initial State | Particle Crush Ratio 500 h | Resistance Value Initial State | Resistance Value 500 h | Capture Efficiency | Impression | Particle Crush Ratio Initial State | Particle Crush Ratio 500 h | Resistance Value Initial State | Resistance Value 500 h |
|---|---|---|---|---|---|---|---|---|---|---|---|---|
| Pressure 60 MPa | B | OK | A | A | A | A | B | NG | A | A | A | B |
| Pressure 90 MPa | B | OK | A | A | A | A | B | NG | A | A | A | A |

TABLE 5

|  | Comparative Example 6 | Example 13 |
|---|---|---|
| Disposition Of All Conductive Particles | Square Lattice | Square Lattice |
| High Hardness Conductive Particle K Value (N/mm$^2$) | 22000 | 22000 |
| Low Hardness Conductive Particle K Value (N/mm$^2$) | 6000 | 6000 |
| Number Density Ratio (High:low) | 100:0 | 90:10 |
| Total Number Density (Particles/mm$^2$) | 28000 | 28000 |

| Evaluation | Capture Efficiency | Impression | Particle Crush Ratio Initial State | Particle Crush Ratio 500 h | Resistance Value Initial State | Resistance Value 500 h | Capture Efficiency | Impression | Particle Crush Ratio Initial State | Particle Crush Ratio 500 h | Resistance Value Initial State | Resistance Value 500 h |
|---|---|---|---|---|---|---|---|---|---|---|---|---|
| Pressure 90 MPa | A | NG | B | C | B | C | A | OK | A | B | A | B |
| Pressure 120 MPa | A | OK | B | B | A | A | A | OK | A | A | A | A |

|  | Example 14 |
|---|---|
| Disposition Of All Conductive Particles | Square Lattice |
| High Hardness Conductive Particle K Value (N/mm$^2$) | 22000 |
| Low Hardness Conductive Particle K Value (N/mm$^2$) | 6000 |
| Number Density Ratio (High:low) | 70:30 |
| Total Number Density (Particles/mm$^2$) | 28000 |

| Evaluation | Capture Efficiency | Impression | Particle Crush Ratio Initial State | Particle Crush Ratio 500 h | Resistance Value Initial State | Resistance Value 500 h |
|---|---|---|---|---|---|---|
| Pressure 90 MPa | A | OK | A | A | A | B |
| Pressure 120 MPa | A | OK | A | A | A | A |

|  | Example 15 | Example 16 |
|---|---|---|
| Disposition Of All Conductive Particles | Square Lattice | Square Lattice |
| High Hardness Conductive Particle K Value (N/mm$^2$) | 22000 | 22000 |
| Low Hardness Conductive Particle K Value (N/mm$^2$) | 6000 | 6000 |
| Number Density Ratio (High:Low) | 50:50 | 30:70 |
| Total Number Density (Particles/mm$^2$) | 28000 | 28000 |

TABLE 5-continued

| Evaluation | Capture Efficiency | Impression | Particle Crush Ratio Initial State | Particle Crush Ratio 500 h | Resistance Value Initial State | Resistance Value 500 h | Capture Efficiency | Impression | Particle Crush Ratio Initial State | Particle Crush Ratio 500 h | Resistance Value Initial State | Resistance Value 500 h |
|---|---|---|---|---|---|---|---|---|---|---|---|---|
| Pressure 90 MPa | A | OK | A | B | A | B | A | OK | A | B | A | A |
| Pressure 120 MPa | A | OK | A | A | A | A | A | OK | A | A | A | A |

Comparative Example 7

| | |
|---|---|
| Disposition Of All Conductive Particles | Square Lattice |
| High Hardness Conductive Particle K Value (N/mm$^2$) | 22000 |
| Low Hardness Conductive Particle K Value (N/mm$^2$) | 6000 |
| Number Density Ratio (High:Low) | 0:100 |
| Total Number Density (Particles/mm$^2$) | 28000 |

| Evaluation | Capture Efficiency | Impression | Particle Crush Ratio Initial State | Particle Crush Ratio 500 h | Resistance Value Initial State | Resistance Value 500 h |
|---|---|---|---|---|---|---|
| Pressure 90 MPa | A | NG | A | A | A | A |
| Pressure 120 MPa | A | NG | A | A | A | A |

TABLE 6

| | Comparative Example 8 | Example 17 |
|---|---|---|
| Disposition Of All Conductive Particles | Square Lattice | Square Lattice |
| High Hardness Conductive Particle K Value (N/mm$^2$) | 14000 | 14000 |
| Low Hardness Conductive Particle K Value (N/mm$^2$) | 6000 | 6000 |
| Number Density Ratio (High:low) | 100:0 | 90:10 |
| Total Number Density (Particles/mm$^2$) | 28000 | 28000 |

| Evaluation | Capture Efficiency | Impression | Particle Crush Ratio Initial State | Particle Crush Ratio 500 h | Resistance Value Initial State | Resistance Value 500 h | Capture Efficiency | Impression | Particle Crush Ratio Initial State | Particle Crush Ratio 500 h | Resistance Value Initial State | Resistance Value 500 h |
|---|---|---|---|---|---|---|---|---|---|---|---|---|
| Pressure 60 MPa | A | NG | B | C | B | C | A | OK | B | B | B | B |
| Pressure 90 MPa | A | NG | A | A | A | A | A | OK | A | A | A | A |
| Pressure 120 MPa | A | OK | A | A | A | A | A | OK | A | A | A | A |

Example 18

| | |
|---|---|
| Disposition Of All Conductive Particles | Square Lattice |
| High Hardness Conductive Particle K Value (N/mm$^2$) | 14000 |
| Low Hardness Conductive Particle K Value (N/mm$^2$) | 6000 |
| Number Density Ratio (High:low) | 70:30 |
| Total Number Density (Particles/mm$^2$) | 28000 |

| Evaluation | Capture Efficiency | Impression | Particle Crush Ratio Initial State | Particle Crush Ratio 500 h | Resistance Value Initial State | Resistance Value 500 h |
|---|---|---|---|---|---|---|
| Pressure 60 MPa | A | OK | A | B | A | B |
| Pressure 90 MPa | A | OK | A | A | A | A |
| Pressure 120 MPa | A | OK | A | A | A | A |

| | Example 19 | Example 20 |
|---|---|---|
| Disposition Of All Conductive Particles | Square Lattice | Square Lattice |
| High Hardness Conductive Particle K Value (N/mm$^2$) | 14000 | 14000 |

TABLE 6-continued

| | | | | | | | | | | | | | |
|---|---|---|---|---|---|---|---|---|---|---|---|---|---|
| Low Hardness Conductive Particle K Value (N/mm²) | | | | 6000 | | | | | | 6000 | | | |
| Number Density Ratio (High:low) | | | | 50:50 | | | | | | 30:70 | | | |
| Total Number Density (Particles/mm²) | | | | 28000 | | | | | | 28000 | | | |

| | | | Particle Crush Ratio | | Resistance Value | | | | Particle Crush Ratio | | Resistance Value | |
|---|---|---|---|---|---|---|---|---|---|---|---|---|
| Evaluation | Capture Efficiency | Impression | Initial State | 500 h | Initial State | 500 h | Capture Efficiency | Impression | Initial State | 500 h | Initial State | 500 h |
| Pressure 60 MPa | A | OK | A | A | A | B | A | OK | A | A | A | B |
| Pressure 90 MPa | A | OK | A | A | A | A | A | OK | A | A | A | A |
| Pressure 120 MPa | A | OK | A | A | A | A | A | OK | A | A | A | A |

| | Comparative Example 9 |
|---|---|
| Disposition Of All Conductive Particles | Square Lattice |
| High Hardness Conductive Particle K Value (N/mm²) | 14000 |
| Low Hardness Conductive Particle K Value (N/mm²) | 6000 |
| Number Density Ratio (High:low) | 0:100 |
| Total Number Density (Particles/mm²) | 28000 |

| | | | Particle Crush Ratio | | Resistance Value | |
|---|---|---|---|---|---|---|
| Evaluation | Capture Efficiency | Impression | Initial State | 500 h | Initial State | 500 h |
| Pressure 60 MPa | A | NG | A | A | A | B |
| Pressure 90 MPa | A | NG | A | A | A | A |
| Pressure 120 MPa | A | NG | A | A | A | A |

TABLE 7

| | Example 21 | Example 22 |
|---|---|---|
| Disposition Of All Conductive Particles | Square Lattice | Square Lattice |
| High Hardness Conductive Particle K Value (N/mm²) | 9000 | 9000 |
| Low Hardness Conductive Particle K Value (N/mm²) | 6000 | 6000 |
| Number Density Ratio (High:low) | 90:10 | 70:30 |
| Total Number Density (Particles/mm²) | 28000 | 28000 |

| | | | Particle Crush Ratio | | Resistance Value | | | | Particle Crush Ratio | | Resistance Value | |
|---|---|---|---|---|---|---|---|---|---|---|---|---|
| Evaluation | Capture Efficiency | Impression | Initial State | 500 h | Initial State | 500 h | Capture Efficiency | Impression | Initial State | 500 h | Initial State | 500 h |
| Pressure 60 MPa | A | OK | A | A | A | A | A | OK | A | A | A | A |
| Pressure 90 MPa | A | OK | A | A | A | A | A | OK | A | A | A | A |

| | Example 23 |
|---|---|
| Disposition Of All Conductive Particles | Square Lattice |
| High Hardness Conductive Particle K Value (N/mm²) | 9000 |
| Low Hardness Conductive Particle K Value (N/mm²) | 6000 |
| Number Density Ratio (High:low) | 50:50 |
| Total Number Density (Particles/mm²) | 28000 |

| | | | Particle Crush Ratio | | Resistance Value | |
|---|---|---|---|---|---|---|
| Evaluation | Capture Efficiency | Impression | Initial State | 500 h | Initial State | 500 h |
| Pressure 60 MPa | A | OK | A | A | A | A |
| Pressure 90 MPa | A | OK | A | A | A | A |

TABLE 7-continued

|  | Example 24 | Comparative Example 10 |
|---|---|---|
| Disposition Of All Conductive Particles | Square Lattice | Square Lattice |
| High Hardness Conductive Particle K Value (N/mm$^2$) | 9000 | 9000 |
| Low Hardness Conductive Particle K Value (N/mm$^2$) | 6000 | 6000 |
| Number Density Ratio (High:low) | 30:70 | 0:100 |
| Total Number Density (Particles/mm$^2$) | 28000 | 28000 |

| Evaluation | Capture Efficiency | Impression | Particle Crush Ratio | | Resistance Value | | Capture Efficiency | Impression | Particle Crush Ratio | | Resistance Value | |
|---|---|---|---|---|---|---|---|---|---|---|---|---|
|  |  |  | Initial State | 500 h | Initial State | 500 h |  |  | Initial State | 500 h | Initial State | 500 h |
| Pressure 60 MPa | A | OK | A | A | A | A | A | NG | A | A | A | B |
| Pressure 90 MPa | A | OK | A | A | A | A | A | NG | A | A | A | A |

It is apparent from Table 2 that the anisotropic conductive films of Examples 1 to 4, in which both the high hardness conductive particles having a 20% compression elastic modulus of 22000 N/mm$^2$ and the low hardness conductive particles having a 20% compression elastic modulus of 6000 N/mm$^2$ are contained and the conductive particles are disposed at random, have good evaluations in impressions and conduction properties (initial resistance value and 500 h resistance value). On the contrary, both the anisotropic conductive film of Comparative Example 1, which contains only the high hardness conductive particles having a 20% compression elastic modulus of 22000 N/mm$^2$, and the anisotropic conductive film of Comparative Example 2, which contains only the low hardness conductive particles having a 20% compression elastic modulus of 6000 N/mm$^2$, have inferior evaluations in impressions, and the anisotropic conductive film of Comparative Example 1, which contains only the high hardness conductive particles, has an inferior evaluation on a conduction property (500 h). Accordingly, it is inferred that the conductive particles constituted of only the low hardness conductive particles are lacking in hardness and therefore make the impressions hard to see, and the conductive particles constituted of only the high hardness conductive particles are too hard to sufficiently compress and therefore make the impressions hard to see. Note that, when using only the high hardness conductive particles, even if the impressions were evaluated to be OK, the impressions were more easily observed in Examples in which the high hardness conductive particles and the low hardness conductive particles were mixed.

It is apparent from Table 5 that Examples 13 to 16, in which both the high hardness conductive particles having a 20% compression elastic modulus of 22000 N/mm$^2$ and the low hardness conductive particles having a 20% compression elastic modulus of 6000 N/mm$^2$ are contained and the conductive particles are arranged in a square lattice, have good evaluations on impressions and conduction properties (initial resistance value and 500 h resistance value), as in the cases of the above Examples 1 to 4. Comparative Examples 6 and 7, which contained only the high hardness conductive particles or the low hardness conductive particles, had problems in impressions.

It is apparent from Table 3 that all the anisotropic conductive films of Examples 5 to 8, in which both the high hardness conductive particles having a 20% compression elastic modulus of 14000 N/mm$^2$ and the low hardness conductive particles having a 20% compression elastic modulus of 6000 N/mm$^2$ are contained and the conductive particles are disposed at random, have good evaluations on impressions and conduction properties (initial resistance value and 500 h resistance value). In particular, even if a pressure at the time of anisotropic conductive connection is low, i.e. 60 MPa, the evaluations are good. On the contrary, the anisotropic conductive film of Comparative Example 3, which contains only the high hardness conductive particles having a 20% compression elastic modulus of 14000 N/mm$^2$, has an inferior evaluation in impressions, and has an inferior evaluation in a conduction property (500 h) when the pressure at the time of anisotropic conductive connection is 60 MPa. The anisotropic conductive film of Comparative Example 4, which contained only the low hardness conductive particles, had a problem in impressions.

It is apparent from Table 6 that Examples 17 to 20, in which both the high hardness conductive particles having a 20% compression elastic modulus of 14000 N/mm$^2$ and the low hardness conductive particles having a 20% compression elastic modulus of 6000 N/mm$^2$ are contained and the conductive particles are arranged in a square lattice, have good evaluations in impressions and conduction properties (initial resistance value and 500 h resistance value), as in the cases of the above Examples 5 to 8. Comparative Examples 8 and 9, which contained only the high hardness conductive particles or the low hardness conductive particles, had problems in impressions.

It is also apparent from Table 4 that the anisotropic conductive films of Examples 9 to 12, in which both the high hardness conductive particles having a 20% compression elastic modulus of 9000 N/mm$^2$ and the low hardness conductive particles having a 20% compression elastic modulus of 6000 N/mm$^2$ are contained, have good evaluations in impressions and conduction properties (initial resistance value and 500 h resistance value), and even if a pressure at the time of anisotropic conductive connection is low, i.e. 60 MPa, the evaluations are good. The anisotropic conductive film of Comparative Example 5, which contained only the low hardness conductive particles, had a problem in impressions.

It is apparent from Table 7 that Examples 21 to 24, in which both the high hardness conductive particles having a 20% compression elastic modulus of 9000 N/mm$^2$ and the low hardness conductive particles having a 20% compression elastic modulus of 6000 N/mm$^2$ are contained and the conductive particles are arranged in a square lattice, have good evaluations in impressions and conduction properties (initial resistance value and 500 h resistance value), as in the cases of the above Examples 9 to 12, and even if a pressure at the time of anisotropic conductive connection is low, i.e. 60 MPa, the evaluations are good. The anisotropic conductive film of Comparative Example 10, which contained only the low hardness conductive particles, as the conductive particles, had a problem in impressions.

REFERENCE SIGNS LIST 1A high hardness conductive particle
1B low hardness conductive particle
2 insulating resin layer
2b concave (inclination)
2c concave (undulation)
3 conductive particle dispersed layer
4 second insulating resin layer
10A, 10B, 10C, 10D, 10E, 10F, 10G anisotropic conductive film
D average particle diameter of conductive particles
La layer thickness of insulating resin layer
Lb distance between tangential plane in center portion between adjacent conductive particles and deepest portion of conductive particle
Lc diameter of exposed (right above) part of conductive particle at inclination or undulation
Ld maximum diameter of inclination or undulation in insulating resin layer around or right above conductive particle
Le maximum diameter of inclination in insulating resin layer around conductive particle
Lf maximum diameter of undulation in insulating resin layer right above conductive particle

The invention claimed is:

1. An anisotropic conductive film comprising
an insulating resin layer,
high hardness conductive particles having a 20% compression elastic modulus of 8000 to 28000 N/mm$^2$, and
low hardness conductive particles having a lower 20% compression elastic modulus than that of the high hardness conductive particles,
wherein
both the high hardness conductive particles and the low hardness conductive particles are dispersed as conductive particles in the insulating resin layer,
a number density of all the conductive particles is 6000 particles/mm$^2$ or more, and
a number density of the low hardness conductive particles is 10% or more of that of all the conductive particles.

2. The anisotropic conductive film according to claim 1, wherein the 20% compression elastic modulus of the low hardness conductive particles is 10% or more and 70% or less of the 20% compression elastic modulus of the high hardness conductive particles.

3. The anisotropic conductive film according to claim 1, wherein the number density of the low hardness conductive particles is 20% or more and 80% or less of that of all the conductive particles.

4. The anisotropic conductive film according to claim 1, wherein
an average particle diameter of all the conductive particles is less than 10 μm, and
the number density of all the conductive particles is 6000 particles/mm$^2$ or more and 42000 particles/mm$^2$ or less.

5. The anisotropic conductive film according to claim 1, wherein
an average particle diameter of all the conductive particles is 10 μm or more, and
the number density of all the conductive particles is 20 particles/mm$^2$ or more and 2000 particles/mm$^2$ or less.

6. The anisotropic conductive film according to claim 1, wherein
the conductive particles including the high hardness conductive particles and the low hardness conductive particles are regularly disposed in a plan view, and
positions thereof in a thickness direction of the film are uniform.

7. The anisotropic conductive film according to claim 6, wherein a proportion of number of the conductive particles including the high hardness conductive particles and the low hardness conductive particles that are present without being in contact with each other is 95% or more.

8. The anisotropic conductive film according to claim 1, wherein the high hardness conductive particles and the low hardness conductive particles are dispersed at random.

9. The anisotropic conductive film according to claim 1, wherein an inclination or an undulation is formed in a surface of the insulating resin layer around the high hardness conductive particles and the low hardness conductive particles with respect to a tangential plane of the insulating resin layer in a center portion between adjacent conductive particles.

10. The anisotropic conductive film according to claim 9, wherein
the surface of the insulating resin layer around the high hardness conductive particles and the low hardness conductive particles in the inclination is lacked with respect to the tangential plane, and
an amount of the resin of the insulating resin layer right above the high hardness conductive particles and the low hardness conductive particles in the undulation is smaller than that when the surface of the insulating resin layer right above the high hardness conductive particles and the low hardness conductive particles is flush with the tangential plane.

11. A connection structure wherein a first electronic component and a second electronic component are anisotropically conductively connected via the anisotropic conductive film according to claim 1.

12. The connection structure according to claim 11, wherein a terminal is formed on a PET substrate in the first electronic component.

13. A method for producing the connection structure according to claim 11, comprising the step of disposing the anisotropic conductive film in between the first electronic component and the second electronic component to anisotropically conductively connect the first electronic component and the second electronic component.

14. The anisotropic conductive film according to claim 1, further comprising a second insulating resin layer, the second insulating resin layer being provided on a first surface of the insulating resin layer.

15. The anisotropic conductive film according to claim 14, further comprising a third insulating resin layer, the third insulating resin layer being provided on a second surface of the insulating resin layer, wherein the second surface of the insulating resin layer opposes the first surface of the insulating resin layer.

16. The anisotropic conductive film according to claim 1, wherein the high hardness conductive particles and the low hardness conductive particles are embedded in the insulating resin layer without being exposed therefrom.

17. The anisotropic conductive film according to claim 1, wherein the high hardness conductive particles and the low hardness conductive particles do not overlap each other in a film thickness direction.

* * * * *